United States Patent
Tsumura et al.

(10) Patent No.: US 7,470,609 B2
(45) Date of Patent: Dec. 30, 2008

(54) SEMICONDUCTOR DEVICE AND METHOD FOR MANUFACTURING THE SAME

(75) Inventors: Kazumichi Tsumura, Kawasaki (JP); Takamasa Usui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 11/698,149

(22) Filed: Jan. 26, 2007

(65) Prior Publication Data

US 2007/0123029 A1    May 31, 2007

Related U.S. Application Data

(62) Division of application No. 10/888,518, filed on Jul. 12, 2004, now Pat. No. 7,205,664.

(30) Foreign Application Priority Data

Apr. 22, 2004    (JP)    ............... 2004-126980

(51) Int. Cl.
    *H01L 21/4763*    (2006.01)
(52) U.S. Cl. ............... 438/622; 438/E21.174
(58) Field of Classification Search ......... 438/622; 257/E21.174
    See application file for complete search history.

(56) References Cited

U.S. PATENT DOCUMENTS

| | | | |
|---|---|---|---|
| 5,592,024 A * | 1/1997 | Aoyama et al. ............ 257/751 |
| 5,695,810 A * | 12/1997 | Dubin et al. ............ 438/643 |
| 6,037,664 A | 3/2000 | Zhao et al. |
| 6,083,842 A * | 7/2000 | Cheung et al. ............ 438/706 |
| 6,287,955 B1 | 9/2001 | Wang et al. |
| 6,331,481 B1 * | 12/2001 | Stamper et al. ............ 438/626 |
| 6,358,832 B1 * | 3/2002 | Edelstein et al. ............ 438/612 |
| 6,429,105 B1 * | 8/2002 | Kunikiyo ............ 438/586 |
| 6,455,415 B1 * | 9/2002 | Lopatin et al. ............ 438/628 |
| 6,605,874 B2 * | 8/2003 | Leu et al. ............ 257/758 |
| 6,680,540 B2 * | 1/2004 | Nakano et al. ............ 257/758 |
| 6,846,227 B2 | 1/2005 | Sato et al. |
| 6,869,878 B1 * | 3/2005 | Adem et al. ............ 438/687 |
| 7,008,872 B2 | 3/2006 | Dubin et al. |
| 7,060,619 B2 * | 6/2006 | Cowley et al. ............ 438/687 |
| 7,344,972 B2 * | 3/2008 | Goodner et al. ............ 438/619 |
| 2001/0019892 A1 | 9/2001 | Komai et al. |
| 2001/0030366 A1 | 10/2001 | Nakano et al. |
| 2003/0087513 A1 | 5/2003 | Noguchi et al. |
| 2003/0098241 A1 | 5/2003 | Homma et al. |
| 2003/0119317 A1 | 6/2003 | Nogami et al. |
| 2004/0046261 A1 | 3/2004 | Ohto et al. |
| 2004/0102031 A1 * | 5/2004 | Kloster et al. ............ 438/619 |

(Continued)

FOREIGN PATENT DOCUMENTS

JP    11-354638 A    12/1999

(Continued)

*Primary Examiner*—Bradley W. Baumeister
*Assistant Examiner*—Igwe U. Anya
(74) *Attorney, Agent, or Firm*—Foley & Lardner LLP

(57) ABSTRACT

A semiconductor device including a multilevel wiring with a small interwiring capacitance is provided by comprising a wiring, a conductive film formed on an upper surface of the wiring to prevent diffusion of a wiring material, and an insulating film which is constituted of low dielectric constant insulating films stacked to form at least two layers, an interface thereof being positioned in a side face of the wiring.

6 Claims, 23 Drawing Sheets

U.S. PATENT DOCUMENTS

| | | |
|---|---|---|
| 2004/0159553 A1 | 8/2004 | Nogami et al. |
| 2004/0183202 A1 | 9/2004 | Usami |
| 2004/0266167 A1* | 12/2004 | Dubin et al. ................ 438/619 |
| 2006/0043589 A1 | 3/2006 | Iwasaki |

FOREIGN PATENT DOCUMENTS

| | | |
|---|---|---|
| JP | 2000-332107 A | 11/2000 |
| JP | 2001-284453 A | 10/2001 |
| JP | 2002-151518 A | 5/2002 |
| JP | 2003-332422 A | 11/2003 |

\* cited by examiner

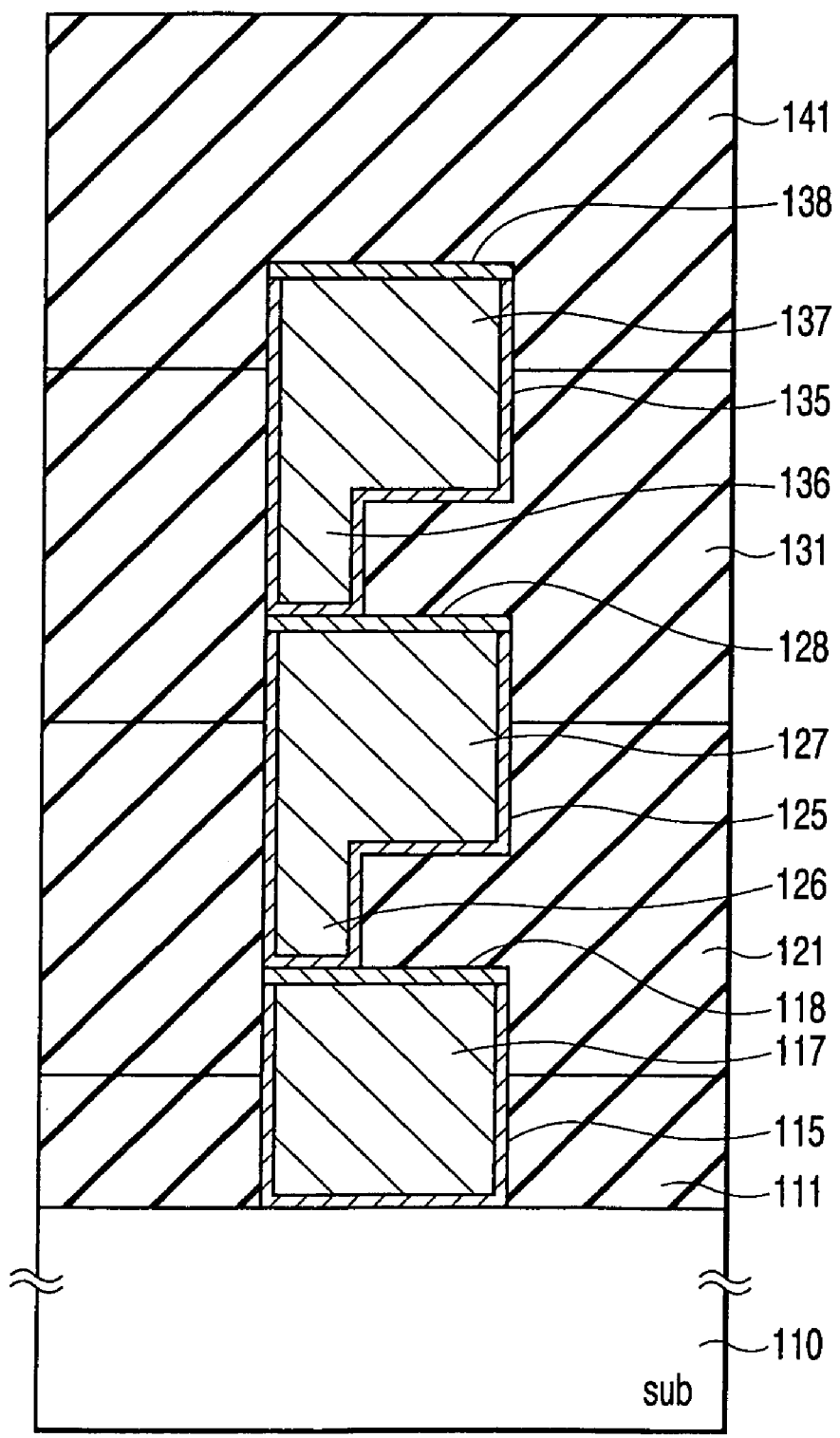
F I G. 1

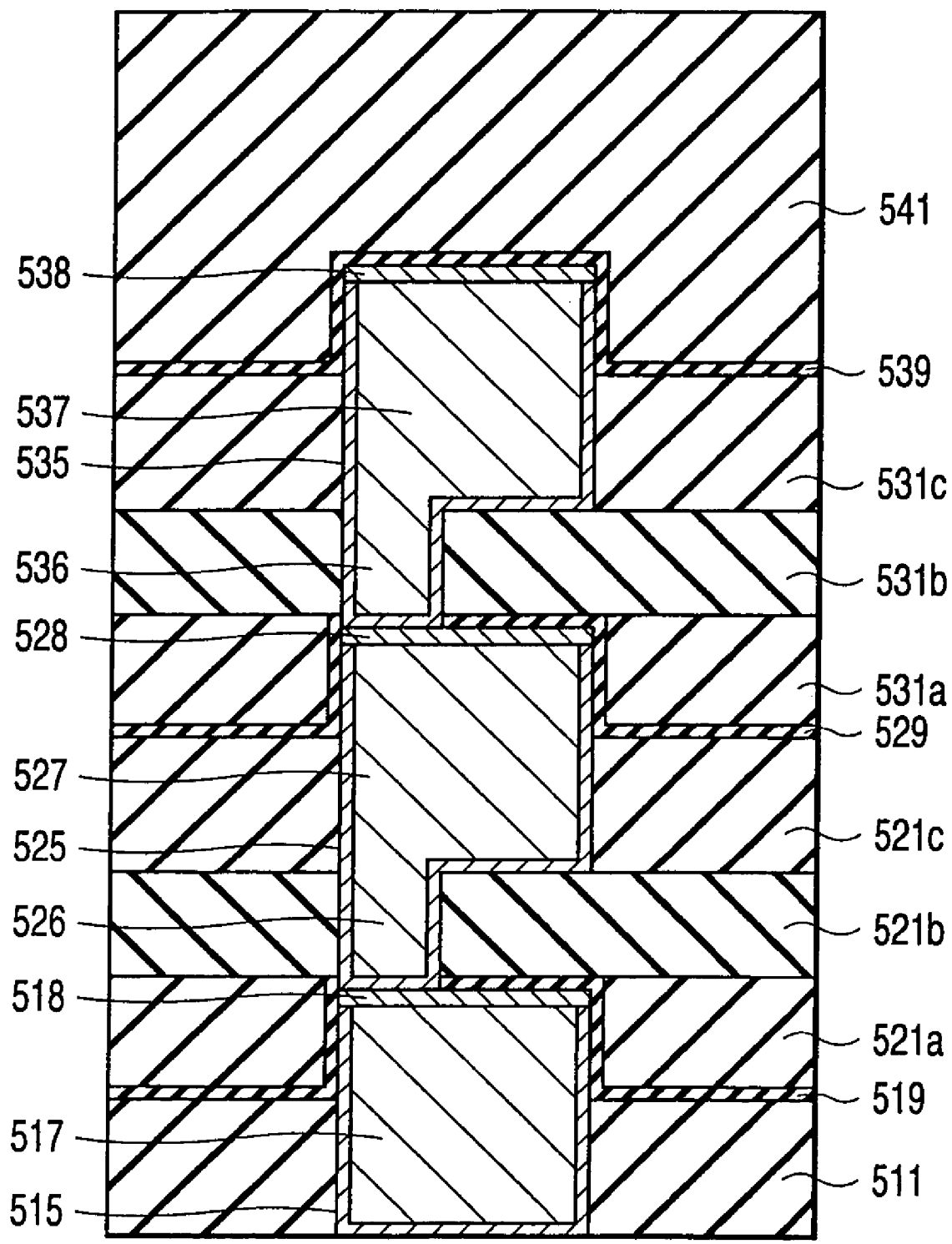
F I G. 15

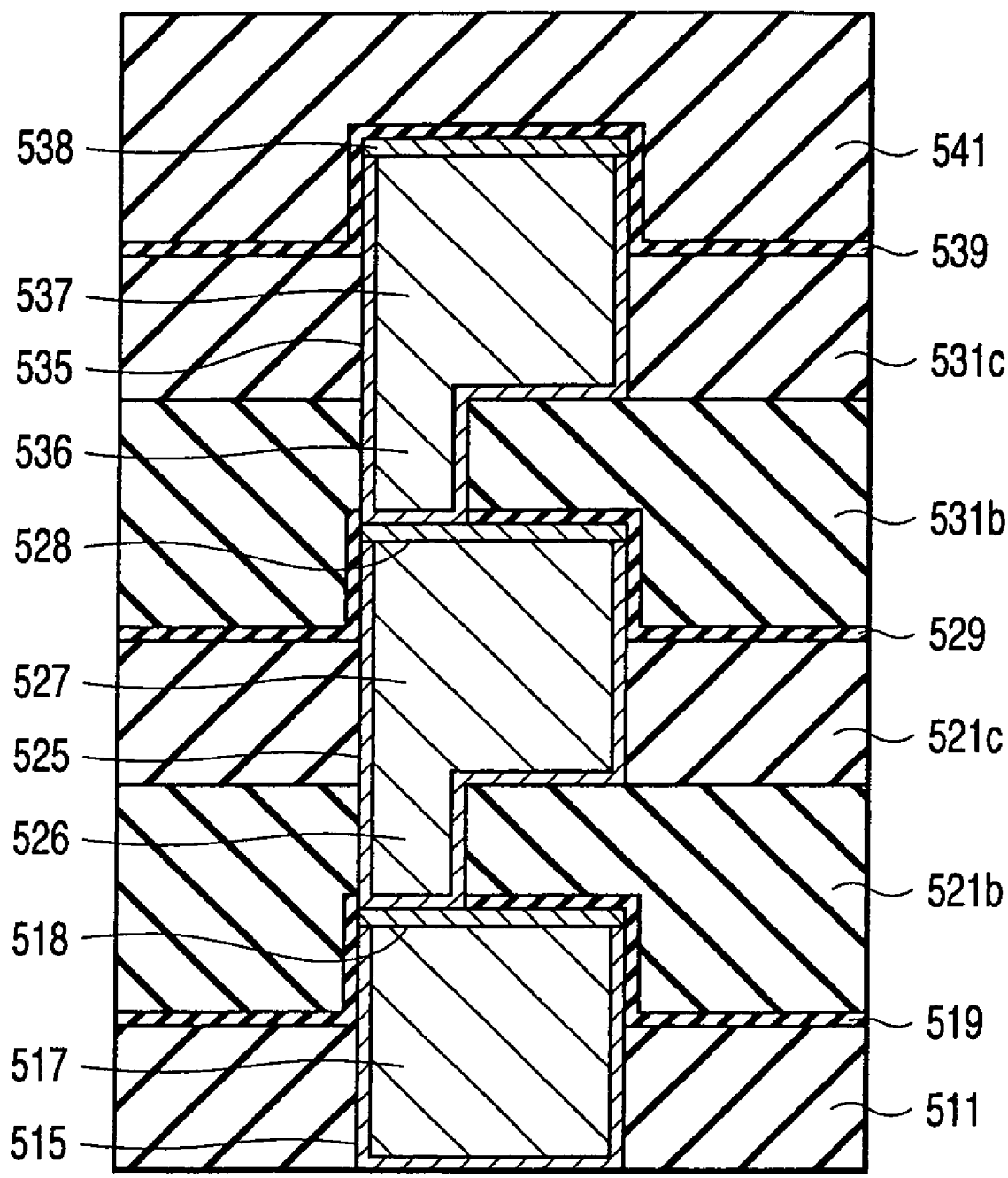
F I G. 21

SEMICONDUCTOR DEVICE AND METHOD FOR MANUFACTURING THE SAME

CROSS-REFERENCE TO RELATED APPLICATIONS

The present application is a divisional of U.S. application Ser. No. 10/888,518, filed Jul. 12, 2004, which claims the benefit of priority from prior Japanese Patent Application No. 2004-126980, filed Apr. 22, 2004, the entire contents of which are incorporated herein by reference.

BACKGROUND OF THE INVENTION

1. Field of the Invention

The present invention relates to a semiconductor device and a method for manufacturing the same. More particularly, the invention relates to a semiconductor device including a multilevel wiring which uses a low dielectric constant insulating film, and a method for manufacturing the same.

2. Description of the Related Art

A semiconductor device, especially a recent semiconductor device such as a system LSI or a DRAM in which miniaturization and high-integration of a semiconductor integrated circuit have progressed, uses a microfabricated multilevel wiring. Accordingly, there is a strong demand for improving wiring performance in order to achieve a higher speed operation. In particular, suppression of a wiring delay caused by wiring resistance (R) and a wiring capacitance (C) is an important task to realize the higher speed operation. The wiring delay is represented by a product of wiring resistance and wiring capacitance (=R×C). Thus, in development of multilevel wirings, in order to suppress a wiring delay, it is one of the important tasks to reduce a wiring capacitance by lowering resistance of the wiring material and lowering dielectric constant of an interwiring or interlevel insulating film. As no practical and proper low-resistant materials other than copper are found as acceptable wiring materials, it is apparently difficult to achieve lowering wiring resistance further. Thus, an interlevel insulating film with a lower dielectric constant material is preferably used to reduce the wiring capacitance.

However, such a low dielectric constant insulating film generally is weak in mechanical strength in nature. Consequently, problems are inherent in a manufacturing process of the semiconductor device, for example, easy to form an deteriorated layer in a surface of the low dielectric constant insulating film, and easy to cause damages such as a scratch.

FIG. 24 is a sectional view showing an example of a copper (Cu) wiring according to a conventional technology. For example, an isolation, a metal-oxide semiconductor field effect transistor (MOSFET), and the like are formed in a semiconductor (e.g., silicon) substrate. To simplify explanation, such components are omitted here, and only a wiring structure formed on the semiconductor substrate is shown. As shown in FIG. 24, a low dielectric constant insulating film 911 having a dielectric constant lower than that of a silicon oxide ($SiO_2$) film is formed as an interwiring insulating film on entire surface of the silicon substrate (not shown), and a high-strength insulating film 912 having a mechanical strength higher than that of the low dielectric constant insulating film 911 is formed thereon. For example, an $SiO_2$ film is used as the high-strength insulating film 912. Next, a wiring trench is formed in the low dielectric constant insulating film 911 and the high-strength insulating film 912 by means of lithography and etching. A Cu film is formed on the entire surface over a Cu diffusion preventing barrier metal film 915 to fill the wiring trench. For example, a tantalum nitride (TaN) is used for the Cu diffusion preventing barrier metal film 915. Then, the Cu film formed in a region other than the wiring trench is removed by chemical mechanical polishing (CMP) to form a Cu wiring 917 in the wiring trench. Then, a Cu diffusion preventing barrier insulating film 919 is formed on the entire surface. For example, an SiN film is used as the Cu diffusion preventing barrier insulating film 919. Thus, the conventional semiconductor device has a structure in which the low dielectric constant insulating film 911, the high-strength insulating film 912, and the Cu diffusion preventing barrier insulating film 919 are alternately stacked. Relative permittivity of the high-strength insulating film 912 and the Cu diffusion barrier insulating film 919 are generally larger than that of the low dielectric constant insulating film 911. Therefore, an overall relative permittivity of the interwiring and interlevel insulating films becomes larger than that of the low dielectric constant insulating film 911.

When a semiconductor device is manufactured by using the low dielectric constant insulating film 911 as the interwiring or interlevel insulating film without using the high-strength insulating film 912 made of $SiO_2$, processing damage should be introduced in the surface of the low dielectric constant insulating film 911 exposed to the surface in the manufacturing process. For example, when a wiring trench or the like is formed in the low dielectric constant insulating film 911 by reactive ion etching (RIE), processing damage may be introduced in the surface thereof due to RIE. Alternatively, when the Cu film formed in the region other than the wiring trench is removed by CMP to leave the Cu wiring 917 in the wiring trench, polishing damage may be introduced in the surface of the low dielectric constant insulating film 911. Such damage will cause problems, for example, an increase in leakage current between the wirings or the wiring levels.

As described above, according to the conventional method, the high-strength insulating film 912 made of $SiO_2$ is used as a kind of protective film to prevent processing damage to the low dielectric constant insulating film 911 therebelow, and not removed in the process. Additionally, the Cu diffusion preventing barrier insulating film 919 of SiN formed on the Cu wiring 917 is not removed from portions other than a contact of the Cu wiring 917 mostly. Consequently, the high-strength insulating film ($SiO_2$) 912 and the Cu diffusion preventing barrier insulating film (SiN) 919 of relative permittivity larger than that of the low dielectric constant insulating film 911 are left in the completed semiconductor device. In other words, when a multilevel wiring is formed by such a method, the multilevel wiring has a laminated structure of a low dielectric constant insulating film and a high dielectric constant insulating film as the interwiring and interlevel insulating films. Thus, in the multilevel wiring formed by the conventional method, while it can be suppressed processing damage caused by RIE, CMP or the like in the surface of the insulating film, there is a problem to suppress an operation delay in a semiconductor device sufficiently because of a larger wiring capacitance compared with that in the case of using only the low dielectric constant insulating film for the interwiring and interlevel insulating film.

BRIEF SUMMARY OF THE INVENTION

Embodiments disclosed herein address the above stated needs by providing a semiconductor device and a manufacturing method therefore.

In an aspect of the invention, a semiconductor device comprises a wiring, a conductive film formed on an upper surface of the wiring to prevent diffusion of a wiring material, and an insulating film which is constituted of low dielectric constant insulating films stacked to form at least two layers, an interface thereof being positioned in a side face of the wiring.

In another aspect, a semiconductor device comprises a first wiring, a second wiring formed above the first wiring, a conductive film formed on an upper surface of each wiring to prevent diffusion of a wiring material, a plug which interconnects the first and second wirings, a first insulating film made of a first low dielectric constant material stacked to form at least two layers, an interface thereof being positioned in a side face of the first wiring, a second insulating film to prevent diffusion of the wiring material formed on at least one interface within the first insulating film and on surfaces of the first wiring positioned above the interface excluding a contact between the plug and the first wiring, and a third insulating film made of a second low dielectric constant material different from that of the first insulating film formed between the first and second wirings.

In another aspect, a method for manufacturing a semiconductor device, comprising depositing a first insulating film made of a low dielectric constant material, depositing a second insulating film having mechanical strength larger than that of the first insulating film thereon, forming a wiring trench in the first and second insulating films, forming a wiring by filling the wiring trench with a wiring material, forming a conductive film on an upper surface of the wiring to prevent diffusion of the wiring material, removing the second insulating film, and depositing a third insulating film made of a low dielectric constant material on the first insulating film and the wiring.

In a further aspect, a method for manufacturing a semiconductor device comprises depositing a first insulating film made of a first low dielectric constant material, depositing a second insulating film having mechanical strength larger than that of the first insulating film thereon, forming a wiring trench in the first and second insulating films, forming a first wiring by filling the wiring trench with a wiring material, forming a conductive film on an upper surface of the first wiring to prevent diffusion of the wiring material, removing the second insulating film, depositing a third insulating film on the first insulating film and the first wiring to prevent diffusion of the wiring material, depositing a fourth insulating film made of the first low dielectric constant material on the third insulating film, planarizing the fourth insulating film to a level of an upper surface of the first wiring, forming a fifth insulating film made of a second low dielectric constant material on the fourth insulating film and the first wiring, and forming a plug in the fifth insulating film to interconnect the first wiring and a second wiring to be formed thereon.

Additional advantages of the invention will be set forth in the description which follows, in part will be obvious from the description, or may be learned by practice of the invention. The advantages of the invention may be realized and obtained be means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional view showing an example of a semiconductor device according to a first embodiment;

FIG. 15 is a sectional view showing an example of a semiconductor device according to a fifth embodiment;

FIG. 21 is a sectional view showing an example of a semiconductor device according to a third modification of the fifth embodiment;

DETAILED DESCRIPTION OF THE INVENTION

Figure 2A:
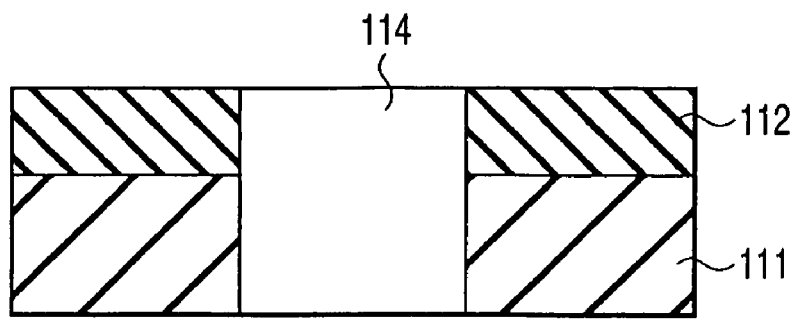
FIGS. 2A to 2D are sectional views illustrating an example of a manufacturing process of the semiconductor device of the first embodiment.

The embodiments of the present invention will be described in detail with reference to the accompanying drawings.

FIRST EMBODIMENT

FIG. 1 is a sectional view showing an example of a multi-level wiring structure of a semiconductor device according to a first embodiment of the present invention. Here, an example of a multilevel wiring of three layers is shown. In the drawing, it is focused on formation of a multilevel wiring structure using low dielectric constant insulating films as interwiring and interlevel insulating films which is directly related to the invention. Accordingly, for example, an isolation, a MOS-FET, and the like are formed on a semiconductor (e.g., silicon) substrate 110 on which the wiring is formed. To simplify explanation, however, structures thereof are omitted here, and only a wiring structure formed on the semiconductor substrate 110 is illustrated.

The multilevel wiring structure of the first embodiment is characterized in that both of interwiring and interlevel insulating films are low dielectric constant insulating films 111, 121, and 131, 141 made of the same low dielectric constant material, the interfaces are existed cyclically and are positioned in side faces of wirings 117, 127, and 137, because the low dielectric constant insulating films have a layered structure, and barrier conductive films 118, 128, and 138 preventing wiring material diffusion are formed on upper surfaces of the wirings 117, 127, and 137.

FIG. 2A to 4B are sectional views illustrating an example of a manufacturing process of the semiconductor device according to the first embodiment of the invention. The manufacturing process will be described below with reference to these drawings.

Step (1) To begin with, as shown in FIG. 2A, a first insulating film 111 made of a low dielectric constant material is deposited on an entire surface of a silicon substrate (not shown). A relative permittivity of this low dielectric constant insulating film 111 is preferably 3 or lower. For example, an organic silicon oxide film such as a methylsiloxane film, an organic film such as polyallylene ether, or a porous film thereof can be used. The low dielectric constant insulating film can be deposited by, e.g., coating or chemical vapor deposition (CVD). Next, a first high-strength insulating film 112 having mechanical strength larger than that of low dielectric constant insulating films is deposited on the first low dielectric constant insulating film 111. As the high-strength insulating film 112, a film formed by CVD, for example, a silicon oxide film ($SiO_2$), or a silicon nitride film (SiN) can be used. Subsequently, a first wiring trench 114 is formed in the deposited two layered insulating films 111, 112 by lithography and etching. That is, a wiring trench pattern is formed in a resist film (not shown) formed on the first high-strength insulating film 112 by lithography, and the insulating films 112 and 111 are sequentially etched off using the resist film as a mask for etching, so that the first wiring trench 114 can be formed.

Figure 2B:
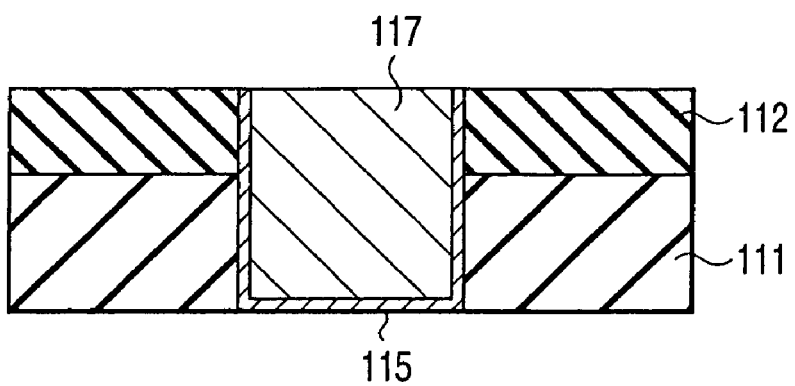

Step (2) Next, as shown in FIG. 2B, a first barrier metal film 115 preventing wiring material diffusion and a Cu seed layer (not shown) are deposited on the entire surface of the substrate to cover inner walls of the first wiring trench 114 by, e.g., physical vapor deposition (PVD) or CDV. As the barrier metal preventing wiring material diffusion, for example, tantalum (Ta), a tantalum nitride (TaN), or a titanium nitride (TiN) can be used. Subsequently, a Cu film is deposited on the entire surface including the inside of the first wiring trench 114 by, e.g., electrolytic plating, to fill the first wiring trench 114. As the wiring metal, in addition to Cu, a low-resistant metal such as a Cu alloy can be used. Then, the Cu film and the first barrier metal film 115 deposited on the first high-strength insulating film 112 are removed by CMP, thus the surface is planarized, so that a first Cu wiring 117 can be formed in the first wiring trench 114.

Figure 2C:
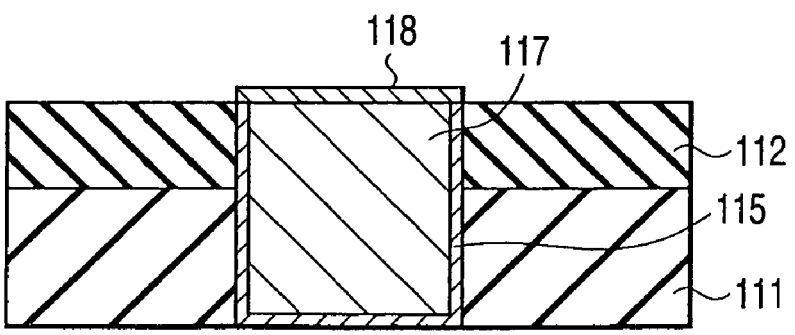

Step (3) Next, as shown in FIG. 2C, a first barrier conductive film 118 preventing wiring material diffusion, that is a function of preventing Cu diffusion, is selectively formed on an upper surface of the exposed first Cu wiring 117. As the barrier conductive film preventing wiring material diffusion, for example, a film which contains a high-melting point metal of cobalt-tungsten (CoW) is acceptable because it can be selectively formed on the Cu wiring by, e.g., electrolytic plating. For the high-melting point metal film containing CoW, for example, a cobalt tungsten boride (COWB) or a cobalt tungsten phosphide (COWP) can be used.

Figure 2D:
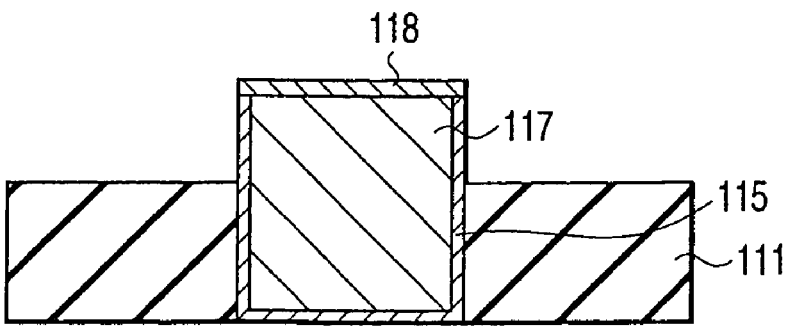

Step (4) Then, as shown in FIG. 2D, of the 2-layer insulating films 111, 112, the upper-layer first high-strength insulating film 112 with larger mechanical strength is removed by etching. Regarding the etching used here, a method of a large selective ratio having the lower-layer first interlevel insulating film 111 made of the low dielectric constant material is acceptable. For example, dry etching such as RIE or CDE using a CF gas or the like, or wet etching which uses an HF solution or the like can be used.

Figure 3A:
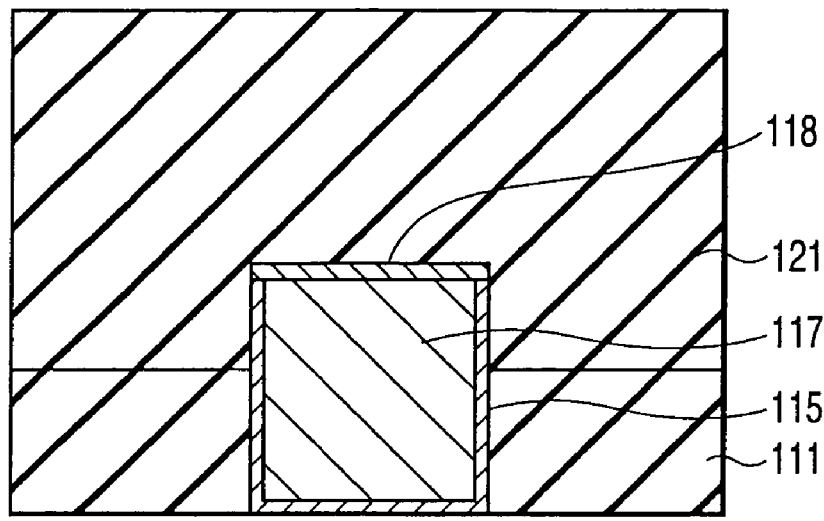
FIGS. 3A, 3B are sectional views illustrating the example of the manufacturing process sequent to FIG. 2D.

Step (5) Subsequently, as shown in FIG. 3A, a second insulating film 121 made of a low dielectric constant material is deposited to cover the entire rugged surface after the removal of the first high-strength insulating film 112. Here, for the second insulating film 121, a low dielectric constant insulating film made of a material the same as the low dielectric constant material of the first insulating film 111 is used. Subsequently, depending on a forming process of the second insulating film 121, a surface thereof can be planarized by CMP as needed. Specifically, if the second insulating film 121 is deposited by coating, planarization by CMP is unnecessary because the surface thereof after the deposition is already planarized. On the other hand, if the second insulating film 121 is deposited by CVD, the surface can be planarized by CMP because after the removal of the first high-strength insulating film 112 rugged parts are remained on the surface thereof after the deposition.

Figure 3B:
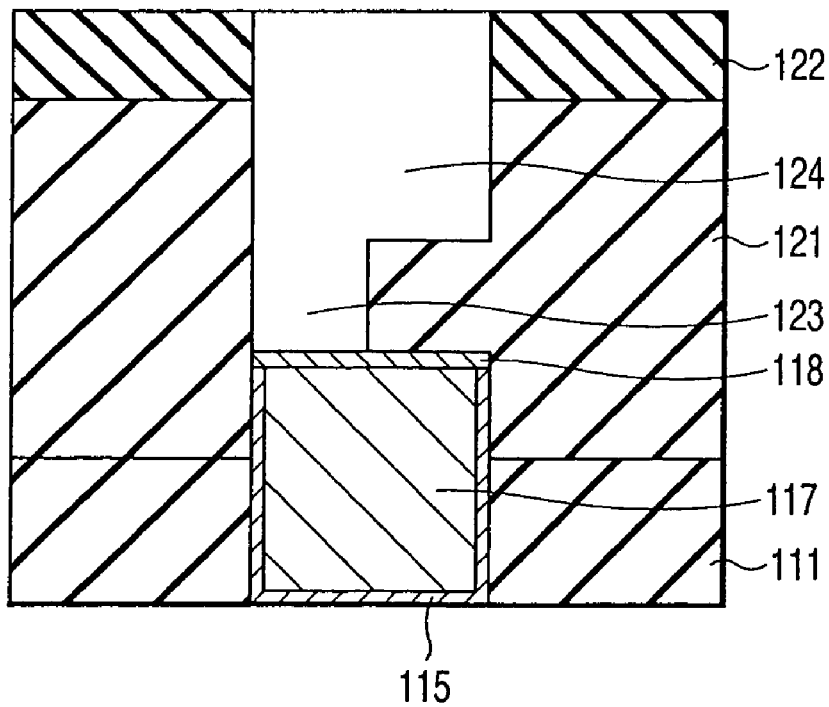

Step (6) Next, a second high-strength insulating film 122 having larger mechanical strength than that of the low dielectric constant material is formed on the second insulating film 121. The second high-strength insulating film 122 may be similar to, or different from the first high-strength insulating film 112. Then, as shown in FIG. 3B, a first interlevel contact hole 123 interconnecting the first Cu wiring and a second Cu wiring to be formed thereabove and a second wiring trench 124 can be formed in the two layered insulating films 121, 122 by lithography and etching. For example, a pattern of an interlevel contact hole is formed in a resist film (not shown) formed on the second high-strength insulating film 122 by lithography. The insulating films 122 and 121 are sequentially etched off using the resist film as a mask for the etching, so that the first interlevel contact hole 123 can be formed being connected to the first barrier conductive film 118 on the first Cu wiring 117. Then, a pattern of a second wiring trench is similarly formed in another resist film (not shown) by lithography. The second high-strength insulating film 122 and the second insulating film 121 are removed by etching to a desired depth using the resist film as a mask for the etching, so that the second wiring trench 124 can be formed.

Step (7) Next, as in the case in steps (2) and (3), a second barrier metal film 125 preventing wiring material diffusion and a Cu seed layer (not shown) are deposited on an entire surface to cover inner walls of the first interlevel contact hole 123 and the second wiring trench 124. Subsequently, a Cu film 127 is deposited by, for example, electrolytic plating, on an entire surface of the second barrier metal film 125 and the Cu seed layer which include inside of the first interlevel contact hole 123 and the second wiring trench 124 to fill the first interlevel contact hole 123 and the second wiring trench 124. Then, the Cu film 127 and the second barrier metal film 125 deposited on the surface of the second high-strength insulating film 122 are removed by CMP, thus the surface is planarized, so that a first plug 126 for interconnecting first and second Cu wirings 117, 127, and the second Cu wiring 127 can be formed. Next, a second barrier conductive film 128 preventing wiring material diffusion, that is a function of preventing Cu diffusion, is selectively formed on an exposed surface of the second Cu wiring 127. For the second barrier conductive film 128, a film similar to the first barrier conductive film 118 can be used. For example, it is acceptable to use COWB or COWP which is a high-melting point metal film containing CoW, and which can be deposited on the Cu wiring by selective plating. Accordingly, the second layer Cu wiring 127 shown in FIG. 4A can be formed.

Figure 4A:
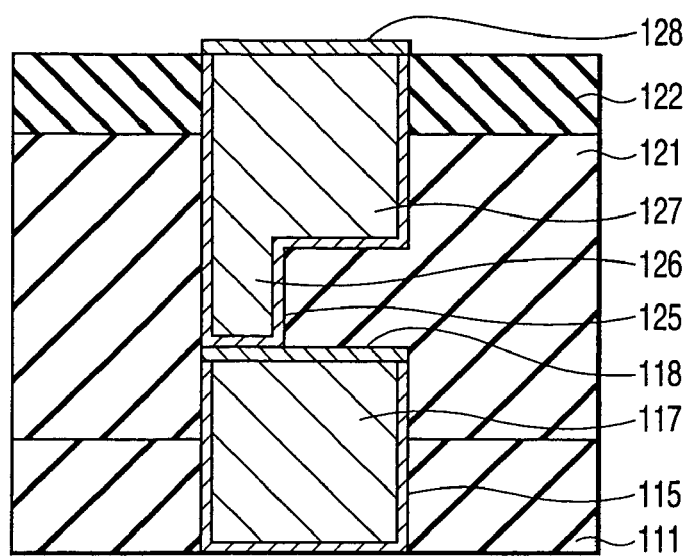
FIGS. 4A, 4B are sectional views illustrating the example of the manufacturing process sequent to FIG. 3B.
Figure 4B:
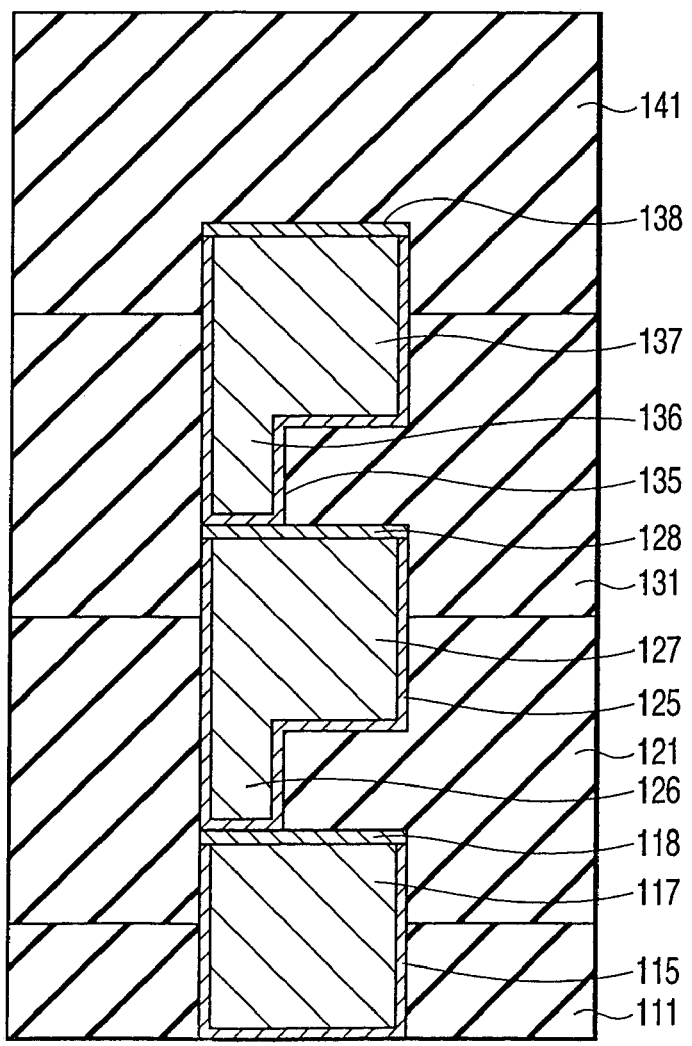

Step (8) Thereafter, the process from the removal of the high-strength insulating film described above in the step (4) (FIG. 2D) to the formation of the barrier conductive film preventing wiring material diffusion described above in the step (7) (FIG. 4A) is repeated by a predetermined number of times, and the process from the step (4) to the step (5) (FIG. 3A) is lastly carried out, so that a multilevel wiring structure shown in FIG. 4B can be formed. The first embodiment has been described as a three layered wiring by way of example. However, the number of wiring levels is not limited to three.

A feature of the multilevel wiring structure according to the first embodiment is that both of interwiring and interlevel insulating films are low dielectric constant insulating films made of the same low dielectric constant material, the interfaces are existed cyclically and are positioned in side faces of wirings because of the layered structure of the low dielectric constant insulating films, and barrier conductive films preventing wiring material diffusion are formed on upper surfaces of the wirings.

Therefore, according to the first embodiment, it can be provided a multilevel wiring with a small interwiring capacitance, since only the low dielectric constant insulating films are formed as the interwiring and interlevel insulating films and no insulating film having a large relative permittivity used in the conventional structure as a part of the interwiring and interlevel insulating films is included, so that only the low dielectric constant insulating films constitute the interwiring and interlevel insulating films. Moreover, even in the manufacturing process, since the insulating film with large mechanical strength is effectively used only in the middle of the process, it can be suppressed damage given to the insulating film having a low dielectric constant material constituting the semiconductor device. As a result, no increase occurs in leakage current between the wirings or between the wiring levels.

The present invention is not limited to the aforementioned embodiment. Various modifications can be made without departing from the teachings of the invention as described later.

SECOND EMBODIMENT

Figure 5:
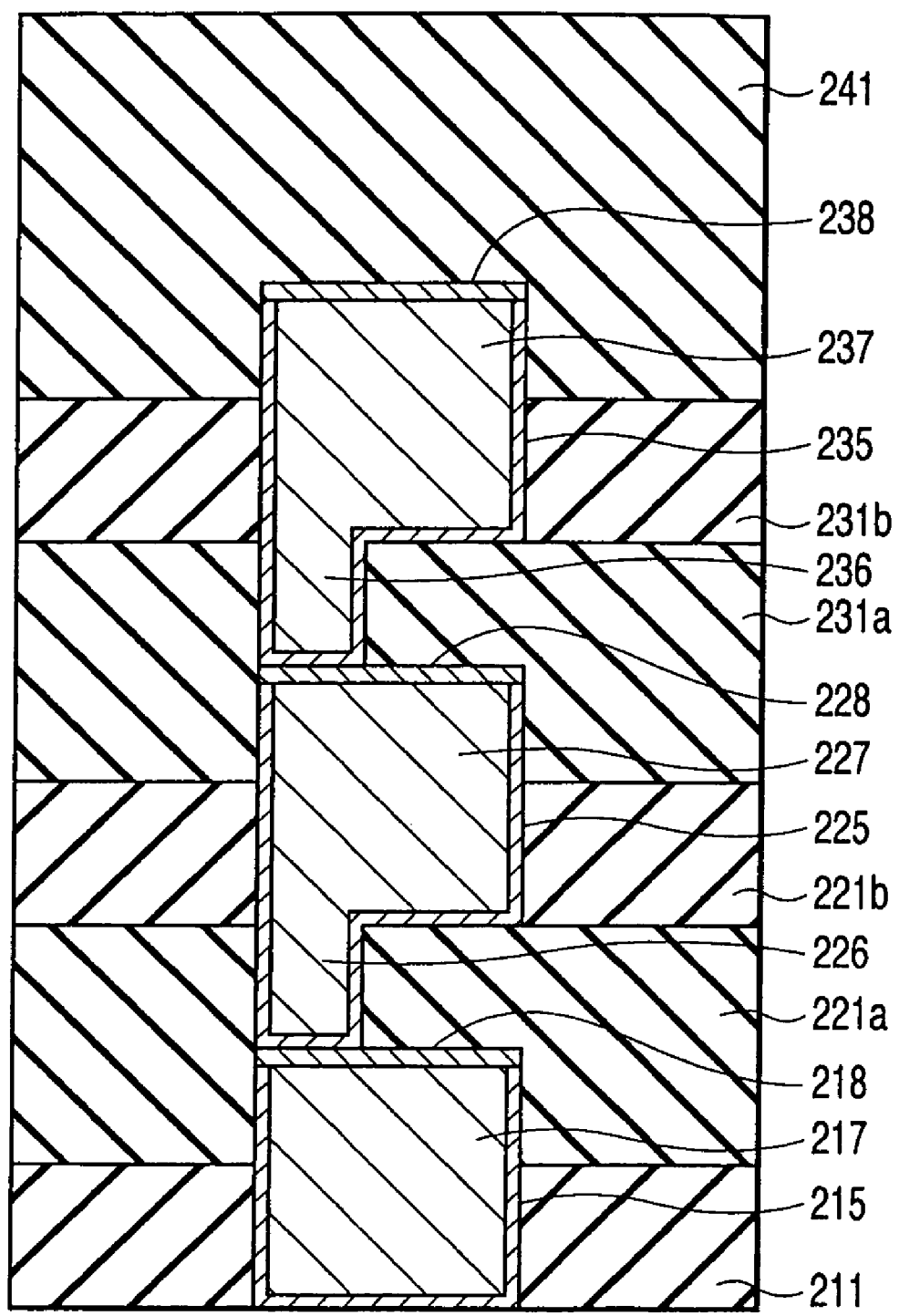
FIG. 5 is a sectional view showing an example of a semiconductor device according to a second embodiment.

FIG. 5 is a sectional view showing an example of a multilevel wiring structure of a semiconductor device according to a second embodiment of the present invention. Here, an example of a multilevel wiring of three layers is shown. In the drawing, as in the case of the first embodiment, it is focused on formation of a multilevel wiring structure using low dielectric constant insulating films as interwiring and interlevel insulating films which is directly related to the invention, and only a wiring structure formed on a semiconductor substrate is illustrated.

The multilevel wiring structure of the second embodiment is characterized in that interlevel insulating films are constituted of two different kinds of low dielectric constant insulating films 211, 221b and 231b, and 221a, 231a and 241, the interfaces are existed cyclically and are positioned in side faces of wirings 217, 227, and 237 because of a layered structure of the low dielectric constant insulating films, and barrier conductive films 218, 228, and 238 preventing wiring material diffusion are formed on upper surfaces of the wirings 217, 227, and 237.

FIGS. 6A to 7B are sectional views illustrating an example of a manufacturing process of the semiconductor device of the second embodiment of the invention. The manufacturing process will be described below with reference to these drawings.

Figure 6A:
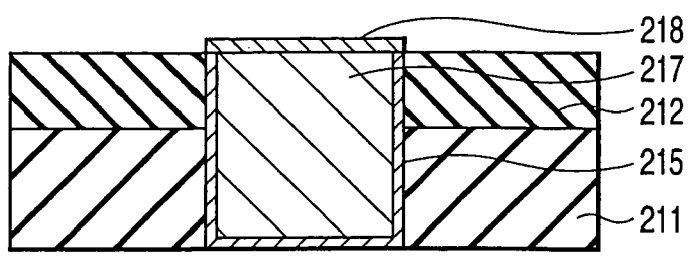
FIGS. 6A to 6D are sectional views illustrating an example of a manufacturing process of the semiconductor device of the second embodiment.

A process from deposition of a first insulating film 211 made of a first low dielectric constant material in step (1) to formation of a first barrier conductive film 218 preventing wiring material diffusion in step (4) is similar to that of the first embodiment. FIG. 6A is the same as FIG. 2C, and shows the first barrier conductive film 218 preventing wiring material diffusion is formed in step (4). Hereinafter, the process from step (1) to step (4) will be briefly described, and then a characteristic process of the second embodiment will be described.

Step (1) To begin with, a first insulating film 211 made of a first low dielectric constant material is deposited on an entire surface of a silicon substrate (not shown). A relative permittivity of the first low dielectric constant insulating film is preferably 3 or lower. For example, an organic silicon oxide film such as a methylsiloxane film, an organic film such as polyallylene ether, or a porous film thereof can be used. A first high-strength insulating film 212 having mechanical strength larger than that of the first low dielectric constant insulating film 211 is deposited thereon. Subsequently, a first wiring trench 214 is formed in the deposited two layered insulating films 211, 212 by lithography and etching.

Step (2) Next, a first barrier metal film 215 preventing wiring material diffusion and a Cu seed layer (not shown) are deposited to cover inner walls of the first wiring trench 214. Subsequently, Cu is deposited on the first barrier metal film 215 and the Cu seed layer which include the first wiring trench 214 to fill the same.

Step (3) Then, a surface is planarized by CMP to form a first Cu wiring 217 in the wiring trench 214.

Step (4) Next, a first barrier conductive film 218 preventing wiring material diffusion, that is a function of preventing diffusion of Cu as a wiring material, is deposited on an exposed surface of the first Cu wiring 217, so that a structure shown in FIG. 6A can be formed. The barrier conductive film preventing wiring material diffusion preferably contains CoW which is a high-melting point metal in its composition. For example, CoWB or CoWP can be used.

Figure 6B:
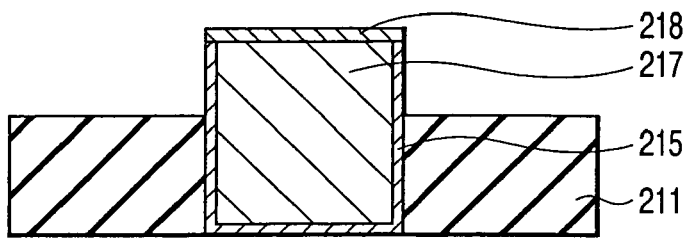

Step (5) Then, as shown in FIG. 6B, of two layered insulating films 211, 212, the upper first high-strength insulating film 212 layer is removed.

Figure 6C:
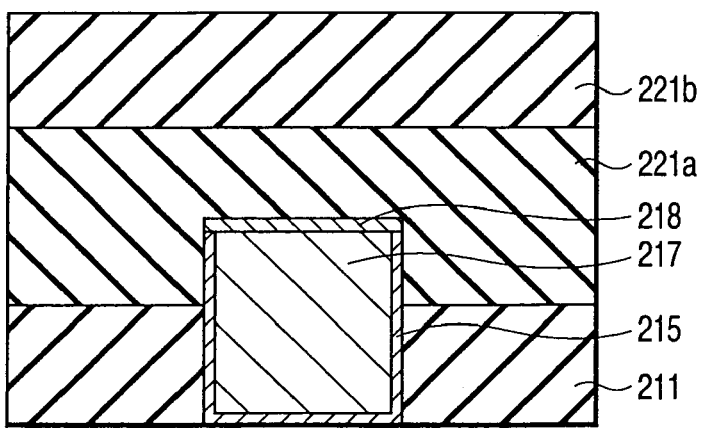

Step (6) Subsequently, as shown in FIG. 6C, a second insulating film 221a made of a second low dielectric constant material different from the first low dielectric constant material is deposited to cover an entire rugged surface after the removal of the first high-strength insulating film 212 by, e.g., coating or CVD. Here, for the second insulating film 221a, the material different from that of the first insulating film 211 is used, but a relative permittivity thereof is preferably 3 or lower as in the case of the first low dielectric constant material. As the second insulating film 221a, under the limitation of the low dielectric constant material different from that of the first insulating film 211, an organic silicon oxide film such as a methylsiloxane film, an organic film such as polyallylene ether, or a porous film thereof can be used. Subsequently, depending on a forming process of the second insulating film 221a, a surface thereof can be planarized by CMP as needed, as in the first embodiment. Then, a third insulating film 221b made of the first low dielectric constant material is deposited on the entire surface of the second insulating film 221a by e.g., coating or CVD.

Figure 6D:
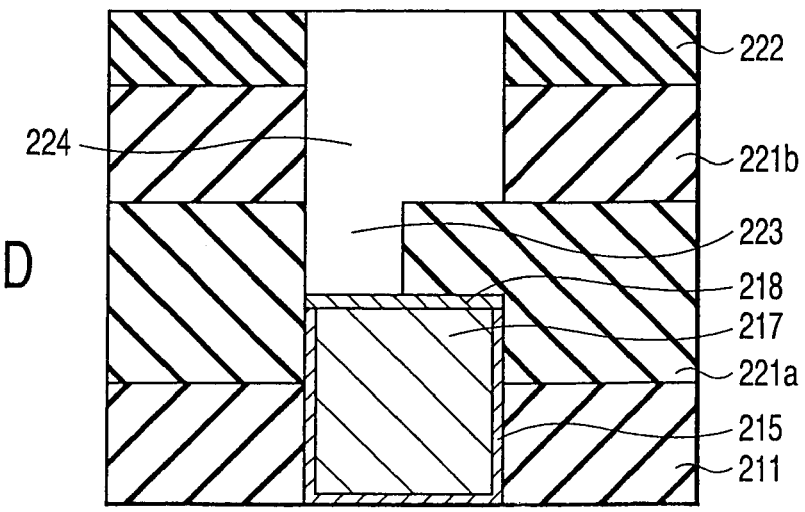
Figure 7A:
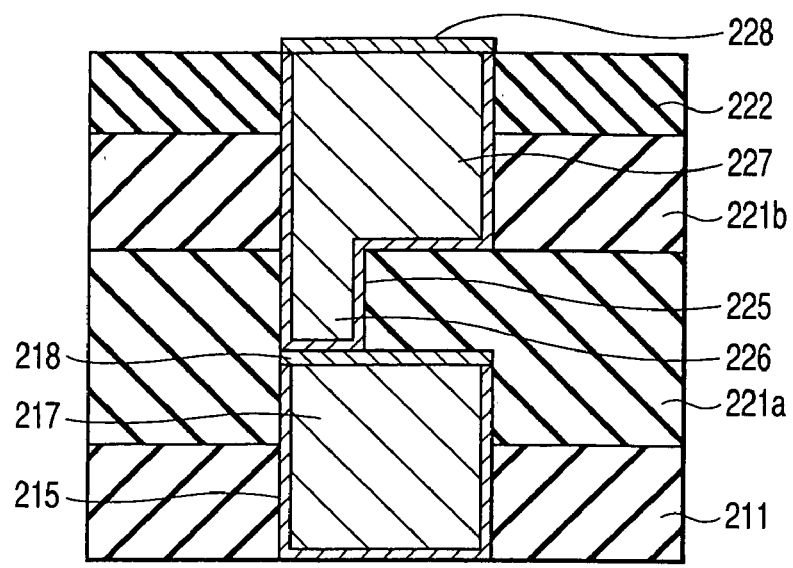
FIGS. 7A, 7B are sectional views illustrating the example of the manufacturing process sequent to FIG. 6D.
Figure 7B:
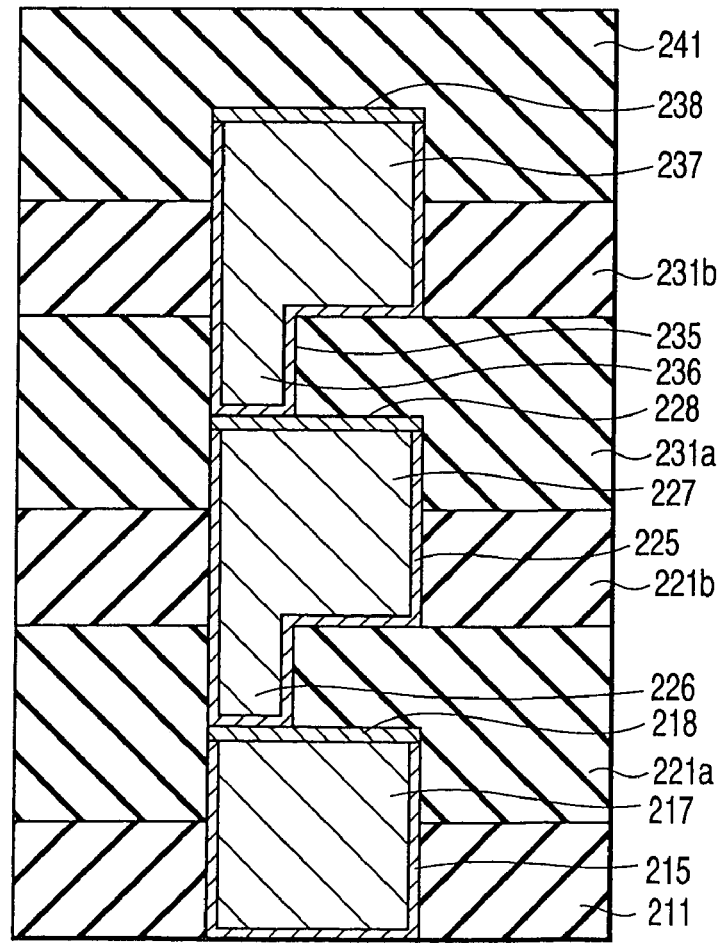

Step (7) Next, a second high-strength insulating film 222 having mechanical strength larger than that of the third insulating film 221b is formed thereon by, e.g., CVD. The second high-strength insulating film 222 may be the same as, or different from the first high-strength insulating film 212. For example, an $SiO_2$ film, or an SiN film can be used. Then, as shown in FIG. 6D, a first interlevel contact hole 223 and a second wiring trench 224 are formed in the 3-layer insulating films 221a, 221b, and 222 by lithography and etching. Then a first interlevel contact hole interconnects the first Cu wiring 217 and a second Cu wiring to be formed thereabove. For example, a pattern of an interlevel contact hole is formed in a resist film (not shown) formed on the second high-strength insulating film 222 by lithography. The insulating films 222, 221b, and 221a are sequentially etched off using the resist film as a mask. Accordingly, the interlevel contact hole 223 can be formed being connected to the first barrier conductive film 218 on the first Cu wiring 217. Subsequently, a pattern of a second wiring trench is similarly formed in another resist film (not shown) by lithography. The third insulating film 221b is selectively etched using the resist film as a mask and the second insulating film 221a as an etching stopper. Accordingly, the second wiring trench is formed in the third insulating film 221b. Thus, the first interlevel contact hole 223 and the second wiring trench 224 can be formed.

Step (8) Next, a process similar to the aforementioned formation of the first Cu wiring 217 is carried out in order to form a second Cu wiring. A second barrier metal film 225 preventing wiring material diffusion and a Cu seed layer (not shown) are deposited on an entire surface to cover inner walls of the first interlevel contact hole 223 and second wiring trench 224. Subsequently, a Cu film is deposited on an entire surface which includes the inside of the first interlevel contact hole 223 and second wiring trench 224 by, for example, electrolytic plating to fill the first interlevel contact hole 223 and the second wiring trench 224. Then, the Cu film and the second barrier metal film 225 deposited on the surface of the second high-strength insulating film 222 are removed by CMP, and the surface is planarized, so that a first plug 226 and a second Cu wiring 227 can be formed. Next, a second barrier conductive film 228 preventing wiring material diffusion, that is a function of preventing Cu diffusion, is, for example, selectively formed on an exposed surface of the second Cu wiring 227. For the second barrier conductive film 228, a high-melting point metal film similar to the first barrier conductive film 218 can be deposited on the Cu wiring by, e.g., selective plating. For example, the high-melting point metal film containing CoW can be used. Accordingly, the second layer Cu wiring 227 shown in FIG. 7A can be formed.

Step (9) Thereafter, the process from the removal of the high-strength insulating film described above in step (5) (FIG. 6B) to the formation of the barrier conductive film preventing wiring material diffusion described above in step (8) (FIG. 7A) is repeated by a predetermined number of times, then the formation of the insulating film made of the second low dielectric constant material in steps (5) and (6) is lastly carried out, so that a multilevel wiring shown in FIG. 7A can be formed. The second embodiment has been described a three layered wiring by way of example. However, the number of wiring levels is not limited to three.

A feature of the multilevel wiring structure of the second embodiment is that the interwiring and interlevel insulating films are low dielectric constant insulating films made of two different kinds of low dielectric constant materials, the interfaces are existed cyclically because of the layered structure of the low dielectric constant insulating films, an interface between the first low dielectric-constant insulating film made of the first low dielectric constant material and the second low dielectric constant insulating film of the second low dielectric constant material deposited thereon is positioned in the side face of the first Cu wiring, an interface between the second low dielectric constant insulating film made of the second low dielectric constant material and the third low dielectric constant insulating film of the first low dielectric constant material deposited thereon coincides with the connected surface of the plug and the second Cu wiring, and the barrier conductive film preventing wiring material diffusion is formed on the upper surface of the Cu wiring. Moreover, since the second Cu wiring trench is formed by selective etching, it enables to enhance process stability more than the first embodiment.

Therefore, according to the second embodiment, no insulating film having a large relative permittivity used in the conventional structure as a part of the interwiring and interlevel insulating films is included, so that only the low dielectric constant insulating films constitute the interwiring and interlevel insulating films. Thus, it can be provided a multilevel wiring having a small interwiring capacitance as in the case of the first embodiment. Moreover, even in the manufacturing process, since the insulating film with large mechanical strength is effectively used only in the middle of the process, it can be suppressed damage given to the insulating film having the low dielectric constant material constituting the semiconductor device. As a result, no increase occurs in leakage current between the wirings or between the wiring levels.

THIRD EMBODIMENT

Figure 8:
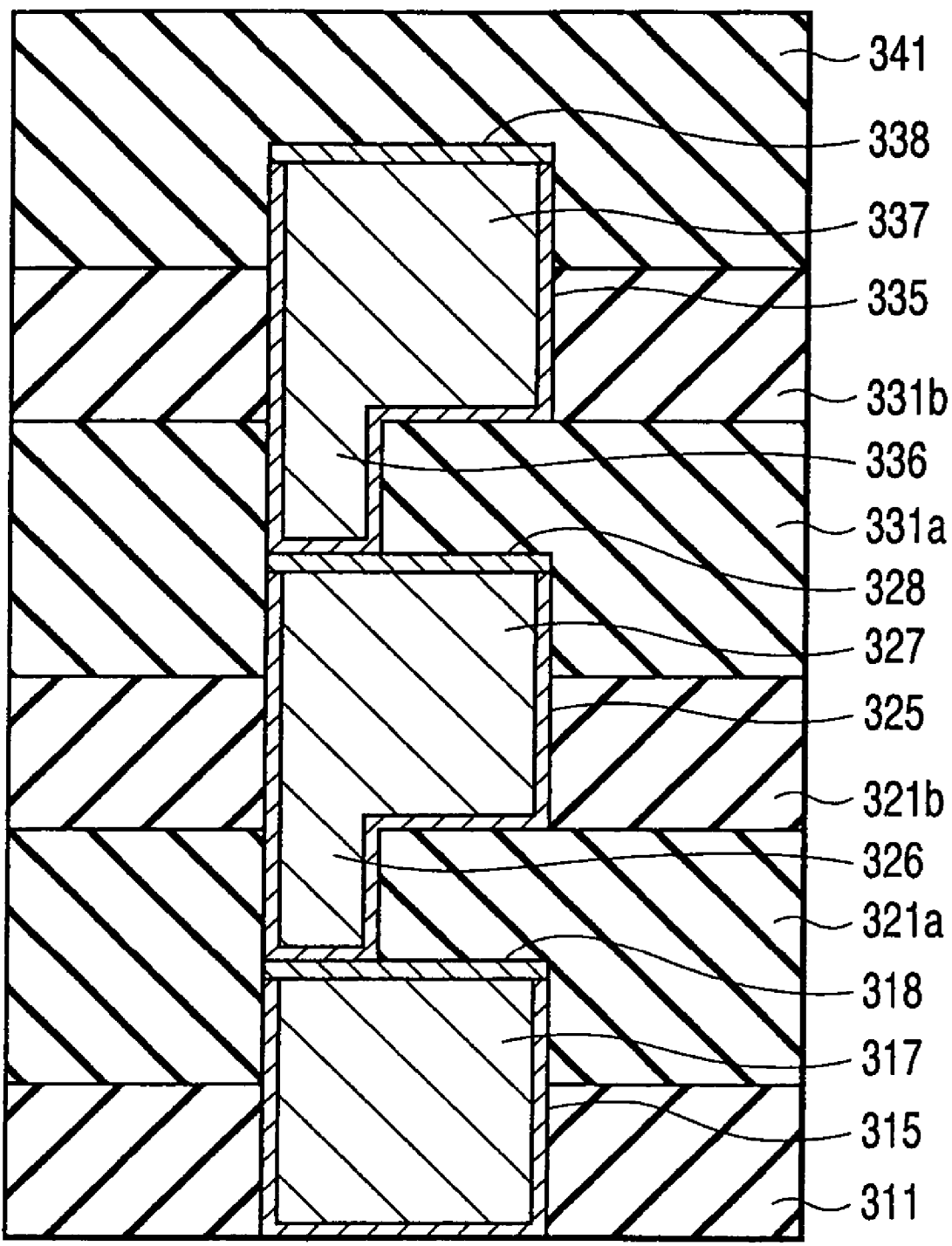
FIG. 8 is a sectional view showing an example of a semiconductor device according to a third embodiment.

FIG. 8 is a sectional view showing an example of a multilevel wiring structure of a semiconductor device according to a third embodiment of the present invention. Here, an example of a multilevel wiring of three layers is shown. In the drawing, as in the case of the first embodiment, it is focused on formation of a multilevel wiring structure using low dielectric constant insulating films as interwiring and interlevel insulating films which is directly related to the invention, and only a wiring structure formed on a semiconductor substrate is illustrated.

The multilevel wiring structure of the third embodiment is formed in such a manner that interwiring and interlevel insulating films are constituted of two different kinds of low dielectric constant insulating films 311, 321b and 331b, and 321a, 331a and 341, the interfaces are existed cyclically and are positioned in side faces of wirings 317, 327, and 337, because of a layered structure of the low dielectric constant insulating films, and barrier conductive films 318, 328, and 338 preventing wiring material diffusion are formed on upper surfaces of the wirings 317, 327, and 337 by means of wiring etch-back and CMP.

FIGS. 9A to 10D are sectional views illustrating an example of a manufacturing process of the semiconductor device according to the third embodiment of the invention. The manufacturing process will be described below with reference to these drawings.

A process from deposition of a first insulating film 311 made of a first low dielectric constant material to formation of a first Cu wiring 317 is the same as that of steps (1) and (2) in the first embodiment, and thus it will be briefly described below. Then, a feature of the third embodiment will be described in detail.

Figure 9A:
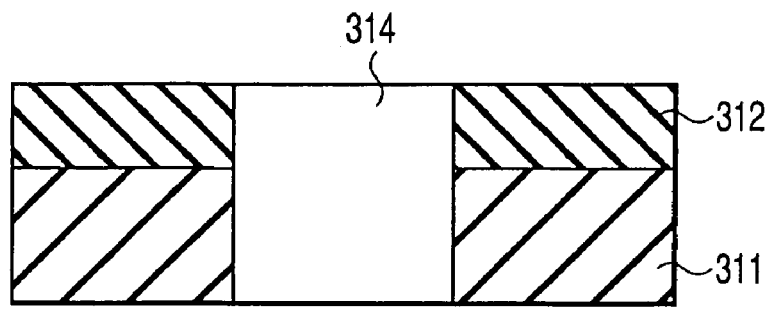
FIGS. 9A to 9D are sectional views illustrating an example of a manufacturing process of the semiconductor device of the third embodiment.
Figure 9B:
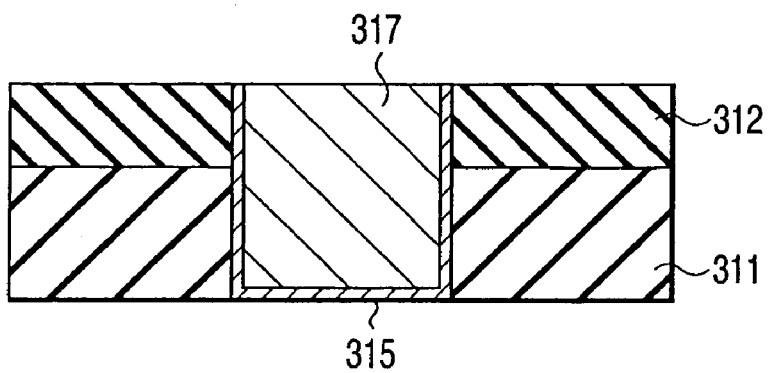

Step (1) To begin with, as shown in FIG. 9A, a first insulating film 311 made of a first low dielectric constant material is deposited on an entire surface of a silicon substrate (not shown). A relative permittivity of the first low dielectric constant insulating film is preferably 3 or lower. For example, an organic silicon oxide film such as a methylsiloxane film, an organic film such as polyallylene ether, or a porous film thereof can be used. A first high-strength insulating film 312 having mechanical strength larger than that of the first low dielectric constant insulating film 311 is deposited thereon. Subsequently, a first wiring trench 314 is formed in the deposited two layered insulating films 311, 312 by lithography and etching.

Step (2) Next, a first barrier metal film 315 preventing wiring material diffusion and a Cu seed layer (not shown) are deposited to cover inner walls of the first wiring trench 314. Subsequently, Cu 317 is deposited on an entire surface including the inside of the first wiring trench 314. Then, a surface is planarized by CMP to form a first Cu wiring 317 in the wiring trench 314. Thus, a structure shown in FIG. 9B can be formed.

Figure 9C:
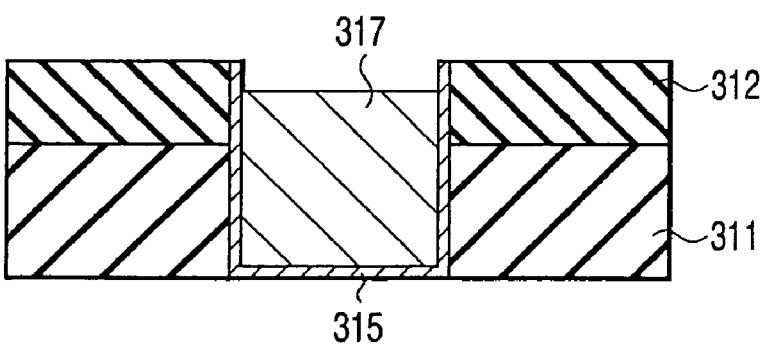

Step (3) Next, as shown in FIG. 9C, a surface of the first Cu wiring 317 is uniformly removed by etching by a predetermined amount in order to form a first barrier conductive film preventing wiring material diffusion on the first Cu wiring 317.

Figure 9D:
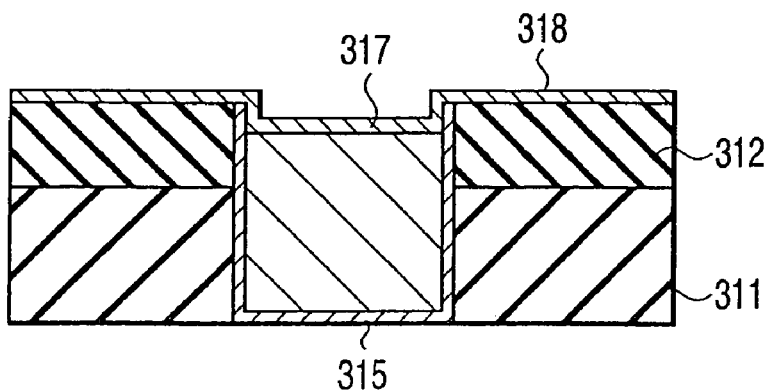

Step (4) Subsequently, as shown in FIG. 9D, a first barrier conductive film 318 made of a barrier metal material preventing wiring material diffusion is formed on an entire surface. For the first barrier conductive film 318, a material similar to that of the first barrier metal film 315 can be used. For example, Ta, TaN, or TiN formed by, for example, sputtering or CVD can be used.

Figure 10A:
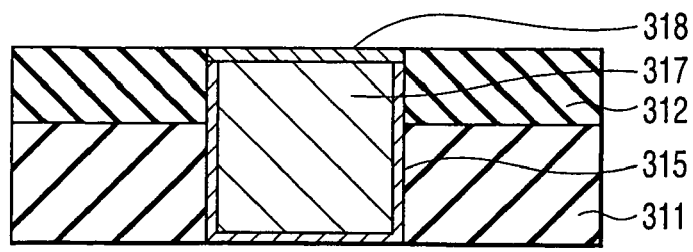
FIGS. 10A to 10D are sectional views illustrating the example of the manufacturing process sequent to FIG. 9D.

Step (5) Next, as shown in FIG. 10A, the first barrier conductive film 318 formed on the first high-strength insulating film 312 is removed by CMP. In this case, since the surface of the first Cu wiring 317 is recessed from that of the first high-strength insulating film 312, the first barrier conductive film 318 is left on the first Cu wiring 317. A structure is characteristically formed in which the first barrier conductive film 318 formed on the insulating film 312 is removed. Additionally, focusing on the Cu wiring, all of surrounding surfaces of the Cu wiring 317 are covered with the barrier metal material preventing wiring material diffusion. Subsequently, as in the case in steps (5) to (8) of the second embodiment, a process from step (6) to step (9) described below is carried out to form interwiring and interlevel insulating films 321a, 321b, a first contact plug 326, and a second Cu wiring 327.

Figure 10B:
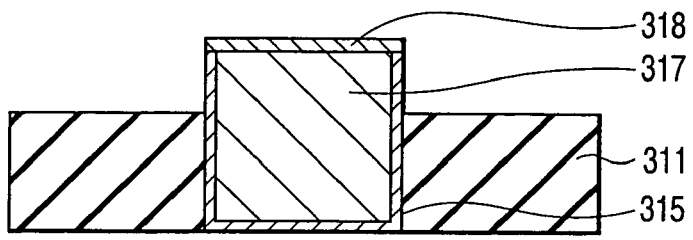

Step (6) That is, as shown in FIG. 10B, of two layered insulating films 311, 312, the upper first high-strength insulating film 312 layer is removed.

Figure 10C:
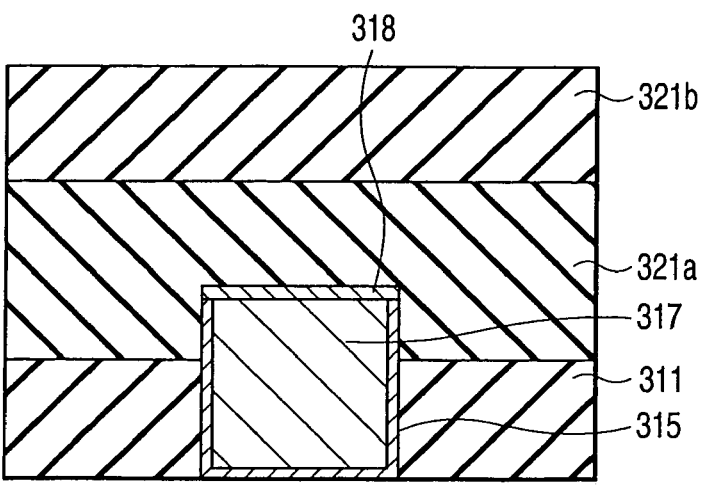

Step (7) Then, as shown in FIG. 10C, a second insulating film 321a made of a second low dielectric constant material different from the first low dielectric constant material is deposited to cover an entire rugged surface after the removal of the first high-strength insulating film 312 by, e.g., coating or CVD. Here, a relative permittivity of the second insulating film 321a is preferably 3 or lower. Subsequently, depending on a forming process of the second insulating film 321a, a surface thereof can be planarized by CMP as needed. Then, a third insulating film 321b made of the first low dielectric constant material is deposited on the entire surface of the second insulating film 321a.

Figure 10D:
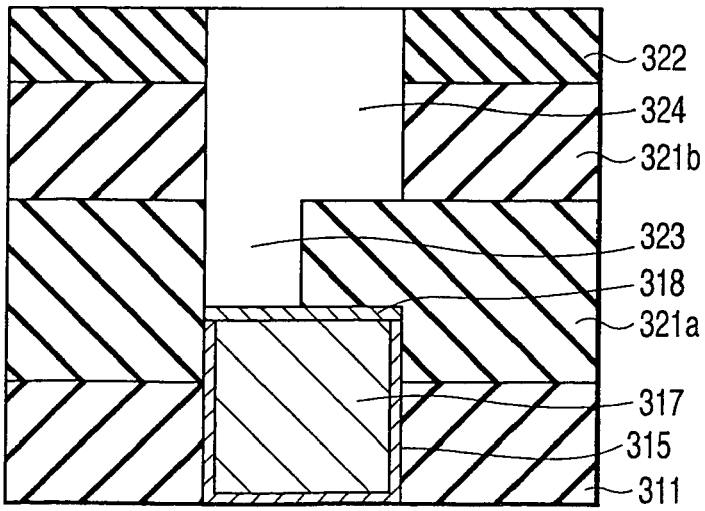

Step (8) Further, a second high-strength insulating film 322 having mechanical strength larger than that of the third low dielectric constant insulating film 321b is formed thereon. The second high-strength insulating film 322 may be the same as, or different from the first high-strength insulating film 312. Then, as shown in FIG. 10D, a first interlevel contact hole 323 and a second wiring trench 324 are formed in the deposited 3-layer insulating films 321a, 321b, and 322 by lithography and etching to interconnect the first Cu wiring and a second Cu wiring formed thereabove.

Step (9) A second barrier metal film 325 preventing wiring material diffusion and a Cu seed layer (not shown) are deposited on an entire surface to cover inner walls of the first interlevel contact hole 323 and second wiring trench 324. Subsequently, a Cu film 327 is deposited on an entire surface which includes the inside of the first interlevel contact hole 323 and second wiring trench 324 by, for example, electrolytic plating to fill the first interlevel contact hole 323 and the second wiring trench 324. Then, the Cu film 327 and the second barrier metal film 325 deposited on the surface of the second high-strength insulating film 322 are removed by CMP, and the surface is planarized. Accordingly, a first plug 326 and a second Cu wiring 327 can be formed.

Figure 11A:
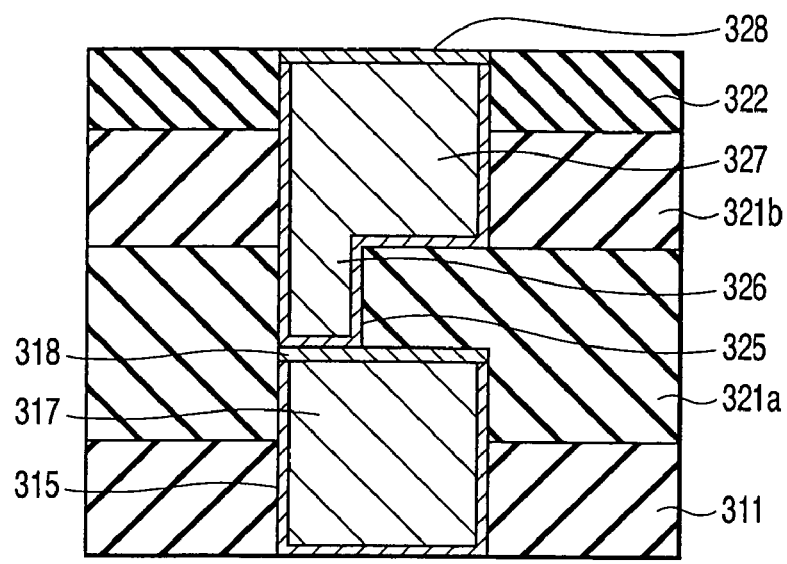
FIGS. 11A, 11B are sectional views illustrating the example of the manufacturing process sequent to FIG. 10D.

Step (10) Next, as in the case in steps (3) to (5), a surface of the second Cu wiring 327 is removed by a predetermined amount, a second barrier conductive film 328 is formed on an entire surface, then the surface is planarized by CMP. Accordingly, the second barrier conductive film 328 preventing wiring material diffusion which is made of a barrier metal material for preventing Cu diffusion can be formed on an upper surface of the second Cu wiring 327. Thus, a structure shown in FIG. 11A having the first contact plug 326, the second Cu wiring 327, and the second barrier conductive film 328 can be formed.

Figure 11B:
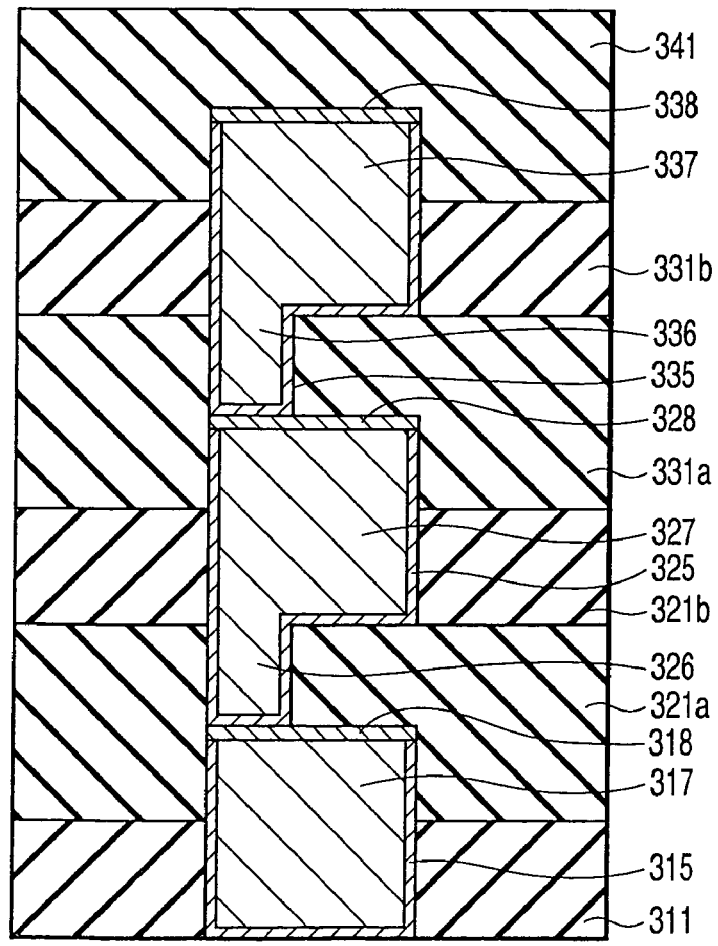

Step (11) Thereafter, the process from the removal of the high-strength insulating film described above in step (6) (FIG. 10B) to the formation of the barrier conductive film preventing wiring material diffusion described above in step (10) (FIG. 11A) is repeated by a predetermined number of times. Lastly, the formation of the insulating film made of the second low dielectric constant material in steps (6) to (8) is carried out, so that a multilevel wiring shown in FIG. 11B can be formed. The third embodiment has been described a three layered wiring by way of example. However, the number of wiring levels is not limited to three.

A feature of the multilevel wiring structure of the third embodiment is that the interlevel insulating films are constituted of low dielectric constant films made of two different kinds of low dielectric constant materials, the interfaces are existed cyclically because of the layered structure of the low dielectric constant insulating films, the interface between the first insulating film made of the first low dielectric constant material and the second insulating film of the second low dielectric constant material deposited thereon is positioned in the side face of the Cu wiring, another interface between the second insulating film made of the second low dielectric constant material and the third insulating film of the first low dielectric constant material deposited thereon coincides with the connected surface of the plug and the second Cu wiring, and the barrier conductive film made of the barrier metal material which prevents wiring material diffusion is formed on the upper surface of the Cu wiring by means of etch-back of the wiring and CMP. Moreover, since the second Cu wiring trench is formed by selective etching, it enables to enhance process stability as in the case of the second embodiment.

Therefore, according to the embodiment, no insulating film having a large relative permittivity used in the conventional structure as a part of the interwiring and interlevel insulating films is included, so that only the low dielectric constant insulating films constitute the interwiring and interlevel insulating films. Thus, it can be provided a multilevel wiring having a small interwiring capacitance as in the cases of the first and second embodiments. Moreover, even in the manufacturing process, since the insulating film with large mechanical strength is effectively used only in the middle of the process, it can be suppressed damage given to the insulating film with the low dielectric constant material constituting the semiconductor device. As a result, no increase occurs in leakage current between the wirings or between the wiring levels.

FOURTH EMBODIMENT

Figure 12:
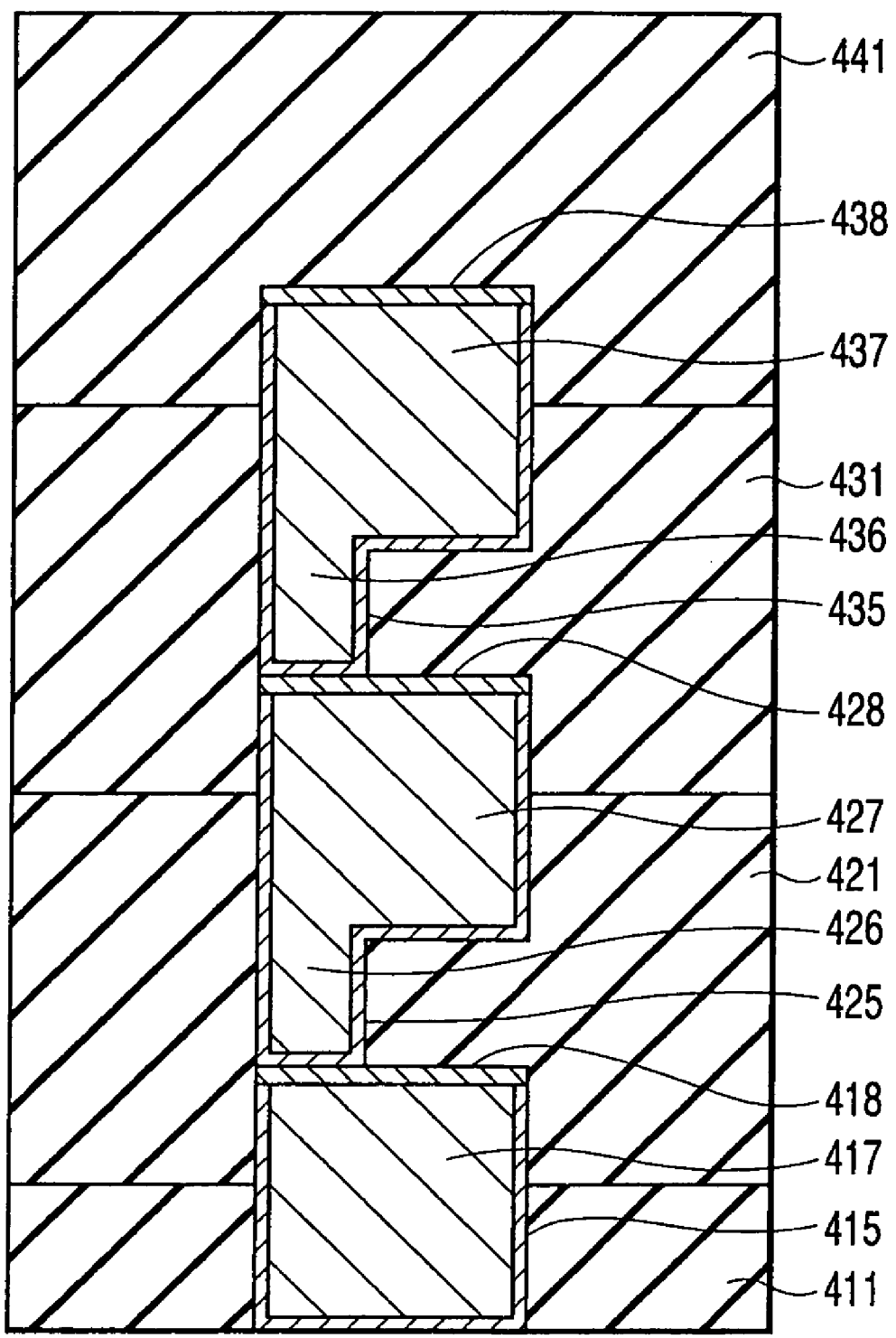
FIG. 12 is a sectional view showing an example of a semiconductor device according to a fourth embodiment.

FIG. 12 is a sectional view showing an example of a multilevel wiring structure of a semiconductor device according to a fourth embodiment of the present invention. Here, an example of a multilevel wiring of three layers is shown. In the drawing, as in the cases of the first to third embodiments, it is focused on formation of a multilevel wiring structure using low dielectric constant insulating films as interwiring and interlevel insulating films which is directly related to the invention, and only a wiring structure formed on a semiconductor substrate is illustrated.

The multilevel wiring structure of the fourth embodiment is formed in such a manner that interwiring and interlevel insulating films are constituted of low dielectric constant insulating films 411, 421, 431, and 441, all made of single low dielectric constant material, the interfaces are existed cyclically and are positioned in side faces of wirings 417, 427, and 437, because of a layered structure of the low dielectric constant insulating films, and barrier conductive films 418, 428, and 438 preventing wiring material diffusion are formed on upper surfaces of the wirings 417, 427, and 437 by means of etch-back of wiring and CMP.

FIGS. 13A to 14A are sectional views illustrating an example of a manufacturing process of the semiconductor device of the fourth embodiment of the invention. The manufacturing process will be described below with reference to these drawings.

Figure 13A:
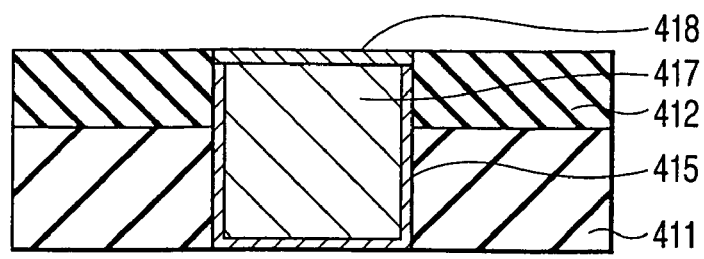
FIGS. 13A to 13D are sectional views illustrating an example of a manufacturing process of the semiconductor device of the fourth embodiment.

A process from formation of a first insulating film 411 made of a low dielectric constant material in step (1) to removal of a first high-strength insulating film 412 in step (5) is similar to that of the third embodiment. The process up to step (5) will be briefly described below. FIG. 13A is the same as FIG. 10A, and shows a first barrier conductive film 418 preventing wiring material diffusion on a first Cu wiring 417 is formed.

Step (1) To begin with, a first insulating film 411 made of a low dielectric constant material is deposited on an entire surface of a silicon substrate (not shown). A relative permittivity of the first insulating film 411 is preferably 3 or lower. For example, an organic silicon oxide film such as a methylsiloxane film, an organic film such as polyallylene ether, or a porous film thereof can be used. A first high-strength insulating film 412 having mechanical strength larger than that of the first insulating film 411 is deposited thereon. Subsequently, a first wiring trench 414 is formed in the two layered insulating films 411, 412 by lithography and etching.

Step (2) Next, a first barrier metal film 415 preventing wiring material diffusion and a Cu seed layer (not shown) are deposited to cover inner walls of the first wiring trench 414. Subsequently, Cu is deposited on the first barrier metal film 415 preventing wiring material diffusion and the Cu seed layer which include the first wiring trench 414 to fill the same. Then, a surface is planarized by CMP to form a first Cu wiring 417 in the wiring trench 414.

Step (3) Next, a surface of the first Cu wiring 417 is uniformly etched off by a predetermined amount.

Step (4) Subsequently, a first barrier conductive film 418 made of a barrier metal material preventing wiring material diffusion is deposited on an entire surface. Then, the first barrier conductive film 418 deposited on the first high-strength insulating film 412 is removed by CMP. As a result, all of surrounding surfaces of the Cu wiring 417 are covered with the barrier metal material preventing wiring material diffusion. Thus, a structure shown in FIG. 13A can be formed.

Figure 13B:
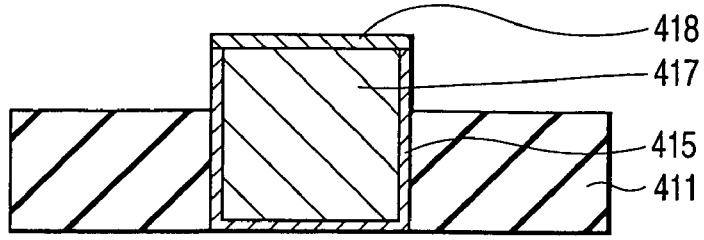

Step (5) Subsequently, as shown in FIG. 13B, of the 2-layer insulating films 411, 412, the upper first high-strength insulating film 412 layer with large mechanical strength is selectively removed by etching.

Thereafter, a process similar to that of the step (5) and after it in the first embodiment is carried out to form a multilevel wiring structure.

Figure 13C:
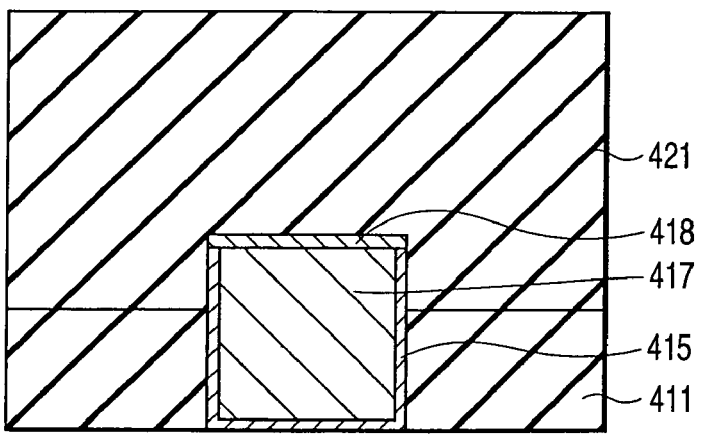

Step (6) Next, as shown in FIG. 13C, a second insulating film 421 made of a low dielectric constant material is deposited to cover an entire rugged surface after the removal of the first high-strength insulating film 412. Here, for the second insulating film 421, a low dielectric constant material similar to that of the first insulating film 411 is used. That is, for example, an organic silicon oxide film such as a methylsiloxane film, an organic film such as polyallylene ether, or a porous film thereof can be used. Then, depending on the forming process of the second insulating film 421, the surface thereof can be planarized by CMP as needed.

Figure 13D:
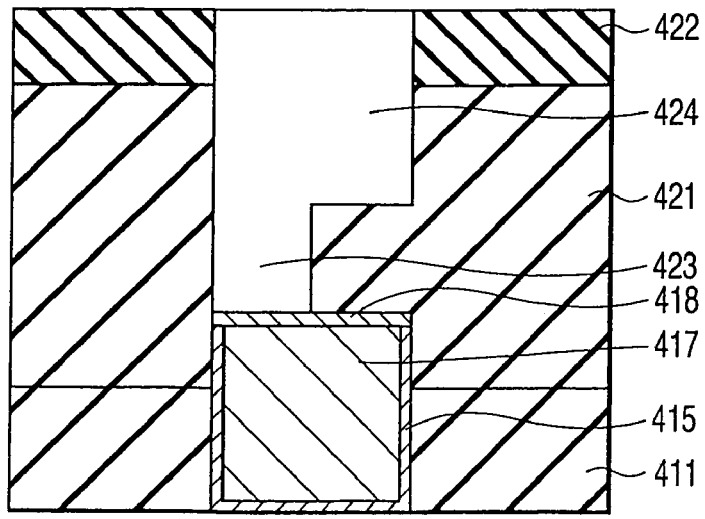
Figure 14A:
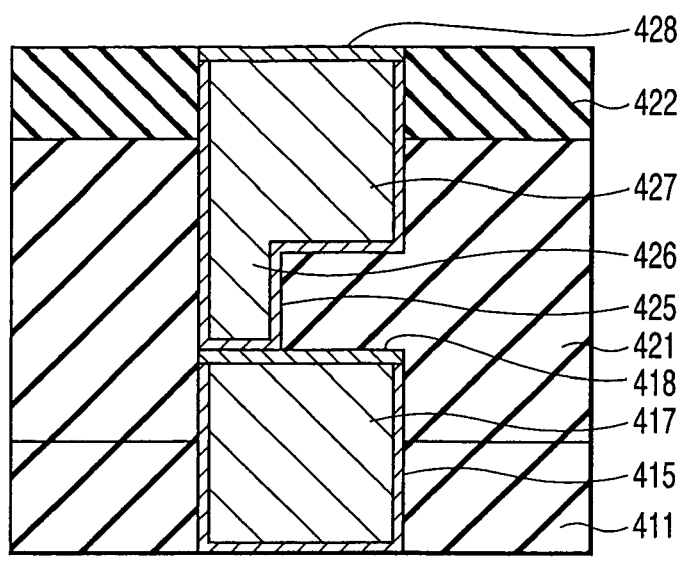
FIGS. 14A, 14B are sectional views illustrating the example of the manufacturing process sequent to FIG. 13D.
Figure 14B:
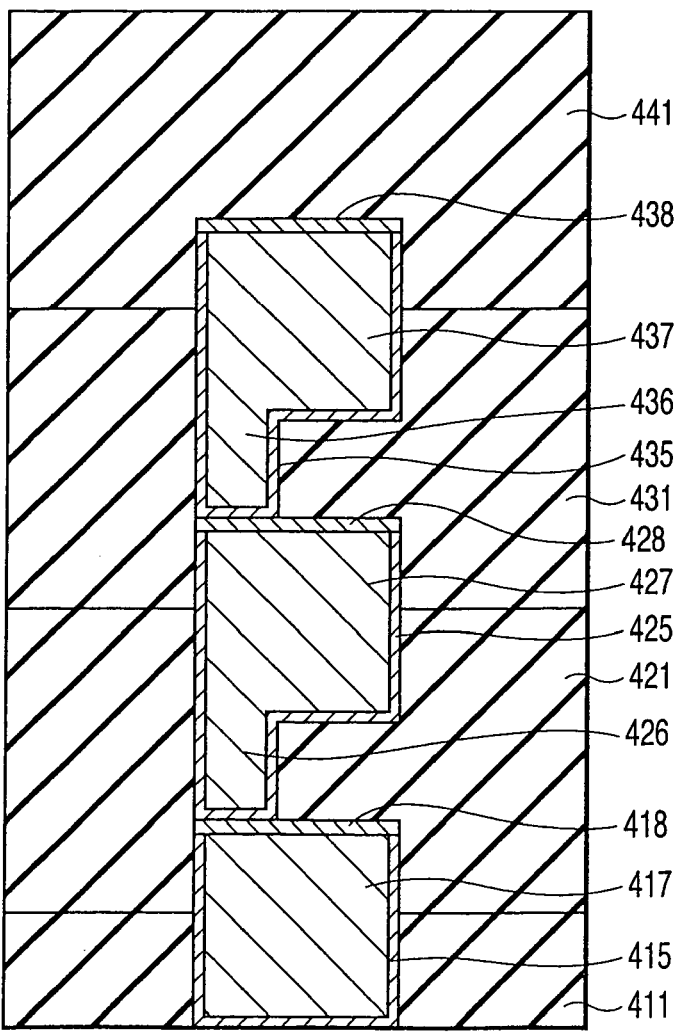

Step (7) Subsequently, a second high-strength insulating film 422 having mechanical strength larger than that of the second insulating film 421 is deposited on an entire surface thereof. The second high-strength insulating film 422 may be similar to, or different from the first high-strength insulating film 412. Then, as shown in FIG. 13D, a first interlevel contact hole 423 and a second wiring trench 424 are formed in the two layered insulating films 421, 422 by lithography and etching to interconnect the first Cu wiring and a second Cu wiring to be formed thereabove.

Step (8) Next, as in steps (2) to (4), a second barrier metal film 425 preventing wiring material diffusion and a Cu seed layer (not shown) are deposited on an entire surface to cover the inner walls of the first interlevel contact hole 423 and second wiring trench 424. Subsequently, for example, a Cu film is deposited on an entire surface which includes the inside of the first interlevel contact hole 423 and second wiring trench 424 by electrolytic plating to fill the first interlevel contact hole 423 and the second wiring trench 424. Then, the Cu film and the second barrier metal film 425 deposited on the surface of the second high-strength insulating film 422 are removed by CMP, and the surface is planarized. Accordingly, a first plug 426 and a second Cu wiring 427 can be formed. Next, a surface of the Cu wiring is removed by a predetermined amount to deposit a second barrier conductive film 428 made of a barrier metal material for preventing Cu diffusion. The second barrier conductive film 428 is deposited on an entire surface, and the surface is planarized by CMP. Accordingly, the second barrier conductive film 428 made of a barrier metal material for preventing Cu diffusion can be formed on the upper surface of the second Cu wiring. Thus, it can be formed the first contact plug 426, the second Cu wiring 427, and the second barrier conductive film 428 shown in FIG. 14A.

Step (9) Thereafter, the process from the removal of the high-strength insulating film in step (5) (FIG. 13B) to the formation of the barrier conductive film preventing wiring material diffusion in step (8) (FIG. 14A) is repeated by a predetermined number of times. Lastly, the steps (5) and (6) (FIG. 13C) are carried out so that a multilevel wiring shown in FIG. 14B can be formed. The fourth embodiment has been described a three layered wiring by way of example. However, the number of wiring levels is not limited to three.

A feature of the multilevel wiring structure of the fourth embodiment is that the interwiring and interlevel insulating films are constituted of insulating films both made of one kind of low dielectric constant materials, the interfaces are existed cyclically because of the layered structure of the low dielectric constant insulating films, the interfaces are positioned in the side faces of the wirings, and the barrier conductive film preventing wiring material diffusion is formed on the upper surface of the wiring by means of etch-back of the wiring and CMP.

Therefore, according to the embodiment, no insulating film having a large relative permittivity used in the conventional structure as a part of the interwiring and interlevel insulating films is included, so that only the low dielectric constant insulating films constitute the interwiring and interlevel insulating films. Thus, it can be provided a multilevel wiring of a small interwiring capacitance as in the cases of the first to third embodiments. Moreover, even in the manufacturing process, since the insulating film with large mechanical strength is effectively used only in the middle of the process, it can be suppressed damage given to the insulating film having the low dielectric constant material constituting the semiconductor device. As a result, no increase occurs in leakage current between the wirings or between the wiring levels.

FIFTH EMBODIMENT

FIG. 15 is a sectional view showing an example of a multilevel wiring structure of a semiconductor device according to a fifth embodiment of the present invention. Here, an example of a multilevel wiring of three layers is shown. In the drawing, as in the cases of the first to fourth embodiments, it is focused on formation of a multilevel wiring structure using low dielectric constant insulating films as interwiring and interlevel insulating films which is directly related to the invention, and only a wiring structure formed on a semiconductor substrate is illustrated.

The multilevel wiring structure of the fifth embodiment is formed in such a manner that interwiring insulating films are constituted of 2-layer insulating films 511 and 521$a$, 521$c$ and 531$a$, and 531$c$ and 541 made of the same low dielectric constant material, interlevel insulating films are constituted of insulating films 521$b$, 531$b$ made of another low dielectric constant material different from those of the interwiring insulating films, barrier conductive films 518, 528, and 538 preventing wiring material diffusion are formed on upper surfaces of wirings 517, 527, and 537, and barrier insulating films 519, 529, and 539 preventing wiring material diffusion are formed on interfaces between the two layered interwiring insulating films 511 and 521$a$, 521$c$ and 531$a$, and 531$c$ and 541, and surfaces of the wirings 517, 527, and 537 thereabove.

FIGS. 16A to 17B are sectional views illustrating an example of a manufacturing process of the semiconductor device of the fifth embodiment of the invention.

Figure 16A:
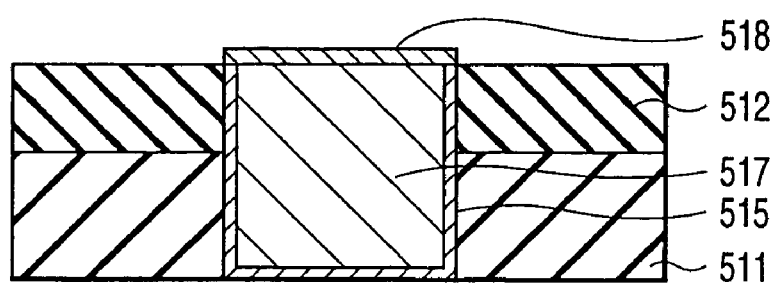
FIGS. 16A to 16D are sectional views illustrating an example of a manufacturing process of the semiconductor device of the fifth embodiment.

A process from deposition of a first insulating film 511 made of a first low dielectric constant material in step (1) to removal of a first high-strength insulating film 512 in step (4) is similar to that of the first embodiment. The process up to the step (4) will be briefly described below. FIG. 16A is the same as FIG. 2C, and shows a first barrier conductive film 518 preventing wiring material diffusion formed on a first Cu wiring 517.

Step (1) To begin with, a first insulating film 511 made of a first low dielectric constant material is deposited on an entire surface of a silicon substrate (not shown). A relative permittivity of the first low dielectric constant insulating film is preferably 3 or lower. For example, an organic silicon oxide film such as a methylsiloxane film, an organic film such as polyallylene ether, or a porous film thereof can be used. A first high-strength insulating film 512 having mechanical strength larger than that of the first low dielectric constant insulating film 511 is deposited thereon. Subsequently, a first wiring trench 514 is formed in the deposited two layered insulating films 511, 512 by lithography and etching.

Step (2) Next, a first barrier metal film 515 preventing wiring material diffusion and a Cu seed layer (not shown) are deposited to cover inner walls of the first wiring trench 514. Subsequently, a Cu film 517 is deposited on the first barrier metal film 515 and the Cu seed layer which include the inside of the first wiring trench 514 to fill the same. Then, a surface is planarized by CMP to form a first Cu wiring 517 in the first wiring trench 514.

Step (3) Next, a first barrier conductive film 518 preventing wiring material diffusion, that is a function of preventing diffusion of Cu as a wiring material, is selectively deposited on an exposed surface of the first Cu wiring 517. The first barrier conductive film 518 preferably contains CoW which is a high-melting point metal alloy in its composition. For example, CoWB or CoWP can be used. Thus, a structure shown in FIG. 16A can be formed.

Figure 16B:
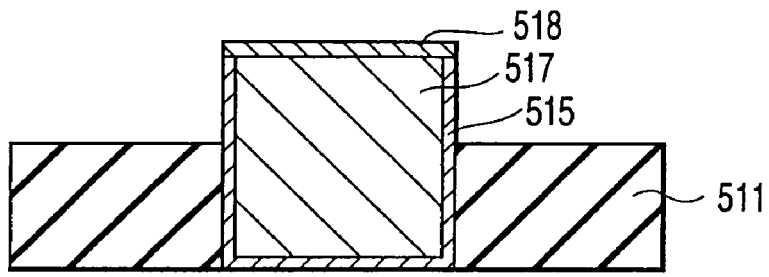

Step (4) Subsequently, as shown in FIG. 16B, of the 2-layer insulating films 511, 512, the upper-layer first high-strength insulating film 512 is removed.

Figure 16C:
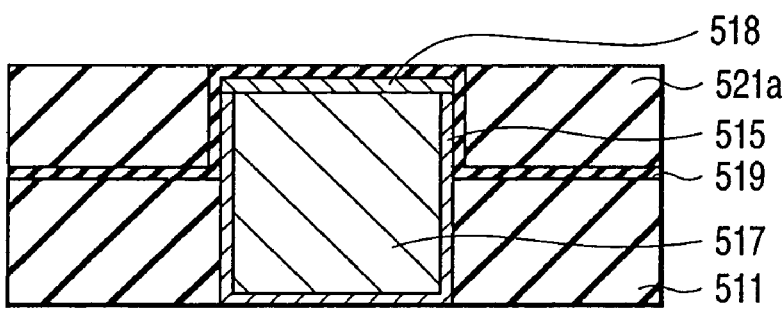

Step (5) Then, as shown in FIG. 16C, a very thin first barrier insulating film 519 preventing wiring material diffusion which prevents diffusion of Cu as a wiring material is deposited on exposed surfaces of the first insulating film 511 and the first Cu wiring 517 to cover an entire rugged surface after the removal of the first high-strength insulating film 512. For the barrier insulating film preventing wiring material diffusion, for example, SiC, SiCN, or SiN deposited by CVD can be used. Next, a second insulating film 521$a$ made of the low dielectric constant material the same as that of the first insulating film is deposited by, e.g., coating or CVD. Subsequently, as in the case of the first embodiment, depending on a forming process of the second insulating film 521$a$, a surface thereof can be planarized by CMP as needed. Then, the second insulating film 521$a$ formed above the first Cu wiring 517 is etched back to form a second insulating film 521$a$ to a height equal to that of the first Cu wiring 517 between the wirings.

Figure 16D:
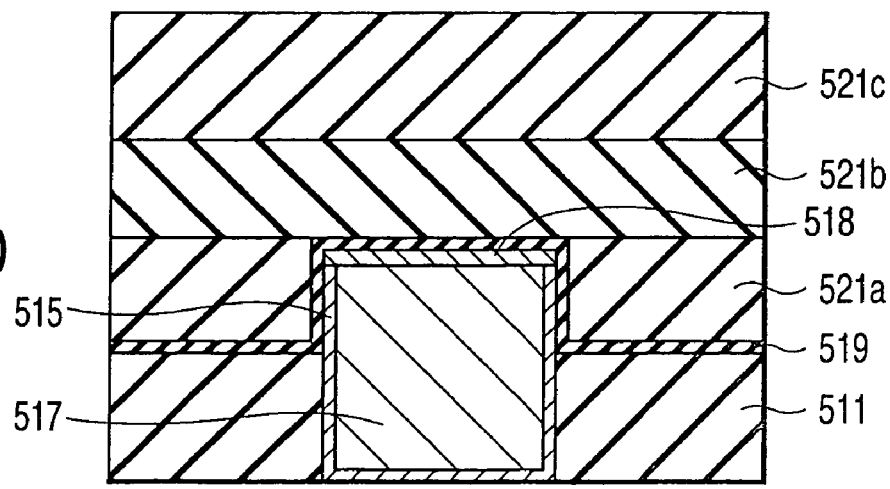

Step (6) Next, as shown in FIG. 16D, a third insulating film 521$b$ made of a second low dielectric constant material different from that of the second insulating film 521$a$ is deposited, and a fourth insulating film 521$c$ made of the first low dielectric constant material is subsequently deposited. The third and fourth insulating films 521$b$, 521$c$ can be deposited by, e.g., coating or CVD.

Figure 17A:
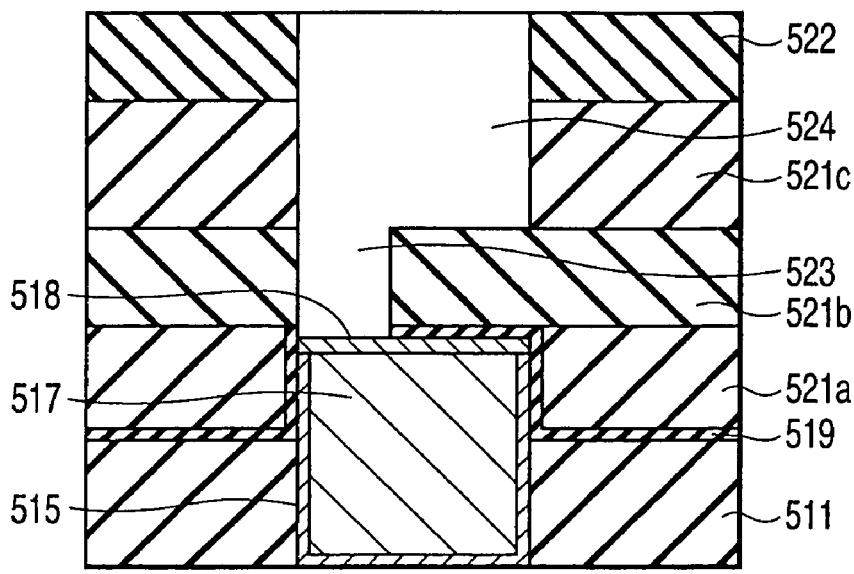
FIGS. 17A, 17B are sectional views illustrating the example of the manufacturing process sequent to FIG. 16D.

Step (7) Further, a second high-strength insulating film 522 having mechanical strength larger than that of the fourth insulating film 521$c$ is deposited thereon by, e.g., CVD. The second high-strength insulating film 522 may be similar to, or different from the first high-strength insulating film 512. For example, an $SiO_2$ film, or an SiN film can be used. Then, as shown in FIG. 17A, the 3-layer insulating films 521$b$, 521$c$, and 522 are processed by lithography and etching. Through the second high-strength insulating film 522 and the fourth insulating film, a first interlevel contact hole 523 is formed in the third insulating film 521b to interconnect the first Cu wiring 517 and a second Cu wiring 527 to be formed thereabove. Subsequently, a second wiring trench 524 is formed in the second high-strength insulating film 522 and the fourth insulating film 521c. For example, the first interlevel contact hole 523 and the second wiring trench 524 can be formed through the following process. A pattern of an interlevel contact hole is formed in a resist film (not shown) formed on the second high-strength insulating film 522 by lithography. The insulating films 522, 521c, and 521b are sequentially etched off using this resist film as a mask for the etching. Lastly, the first barrier insulating film 519 on the first Cu wiring 517 exposed at the bottom of the interlevel contact hole is removed, so that the first interlevel contact hole 523 can be formed to be connected to the first barrier conductive film 518 on the first Cu wiring 517. Regarding etching of the third insulating film 521b, an etching with a large selective ratio to the second insulating film 521a is executed. Thus, even if pattern misalignment occurs in the interlevel contact hole 523 patterning, a process margin can be increased in etching process since almost no etching is carried out for the second insulating film 521a. Subsequently, a pattern of a second wiring trench is similarly formed in another resist film (not shown) by lithography. A second wiring trench 524 is formed by selectively etching the second high-strength insulating film 522 and the fourth insulating film 521c by using this resist film as a mask and the third insulating film 521b as an etching stopper. Thus, the first interlevel contact hole 523 and the second wiring trench 524 can be formed.

Figure 17B:
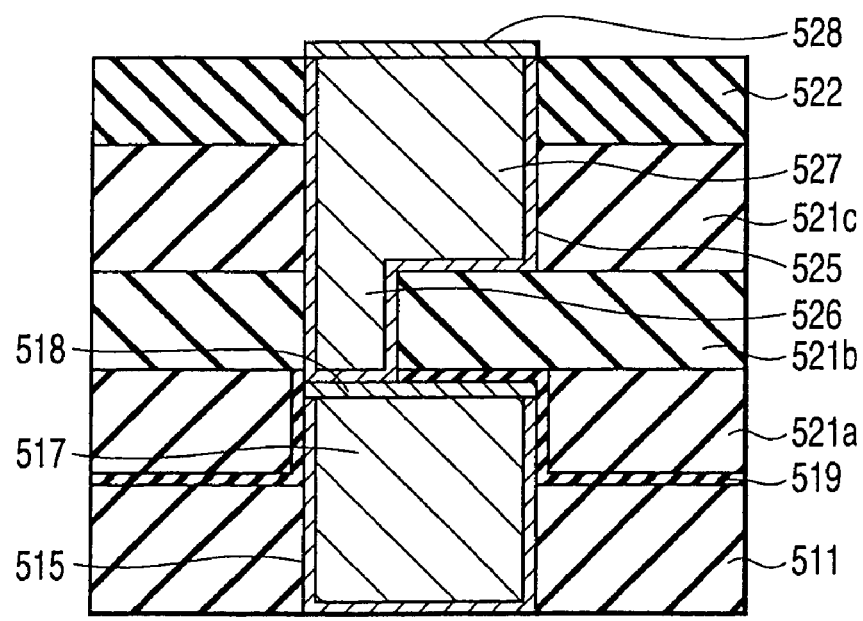

Step (8) Next, a process similar to the aforementioned formation of the first Cu wiring 517 is carried out in order to form a second wiring trench 527 shown in FIG. 17B. A second barrier metal film 525 preventing wiring material diffusion and a Cu seed layer (not shown) are deposited on an entire surface to cover inner walls of the first interlevel contact hole 523 and second wiring trench 524. Subsequently, a Cu film is deposited on an entire surface which includes the inside of the first interlevel contact hole 523 and second wiring trench 524 by, for example, electrolytic plating to fill the first interlevel contact hole 523 and the second wiring trench 524. Then, the Cu film and the second barrier metal film 525 deposited on the surface of the second high-strength insulating film 522 are removed by CMP, and the surface is planarized. Accordingly, a first plug 526 and a second Cu wiring 527 can be formed. Next, a second barrier conductive film 528 having a function of preventing Cu diffusion is selectively deposited on an exposed surface of the second Cu wiring 527. The second barrier conductive film 528 can be deposited on the Cu wiring by, e.g., selective plating, as in the case of the first barrier conductive film 518. For example, a high-melting point metal film containing CoW can be used. Accordingly, the second layer Cu wiring 527 shown in FIG. 17B can be formed.

Figure 18:
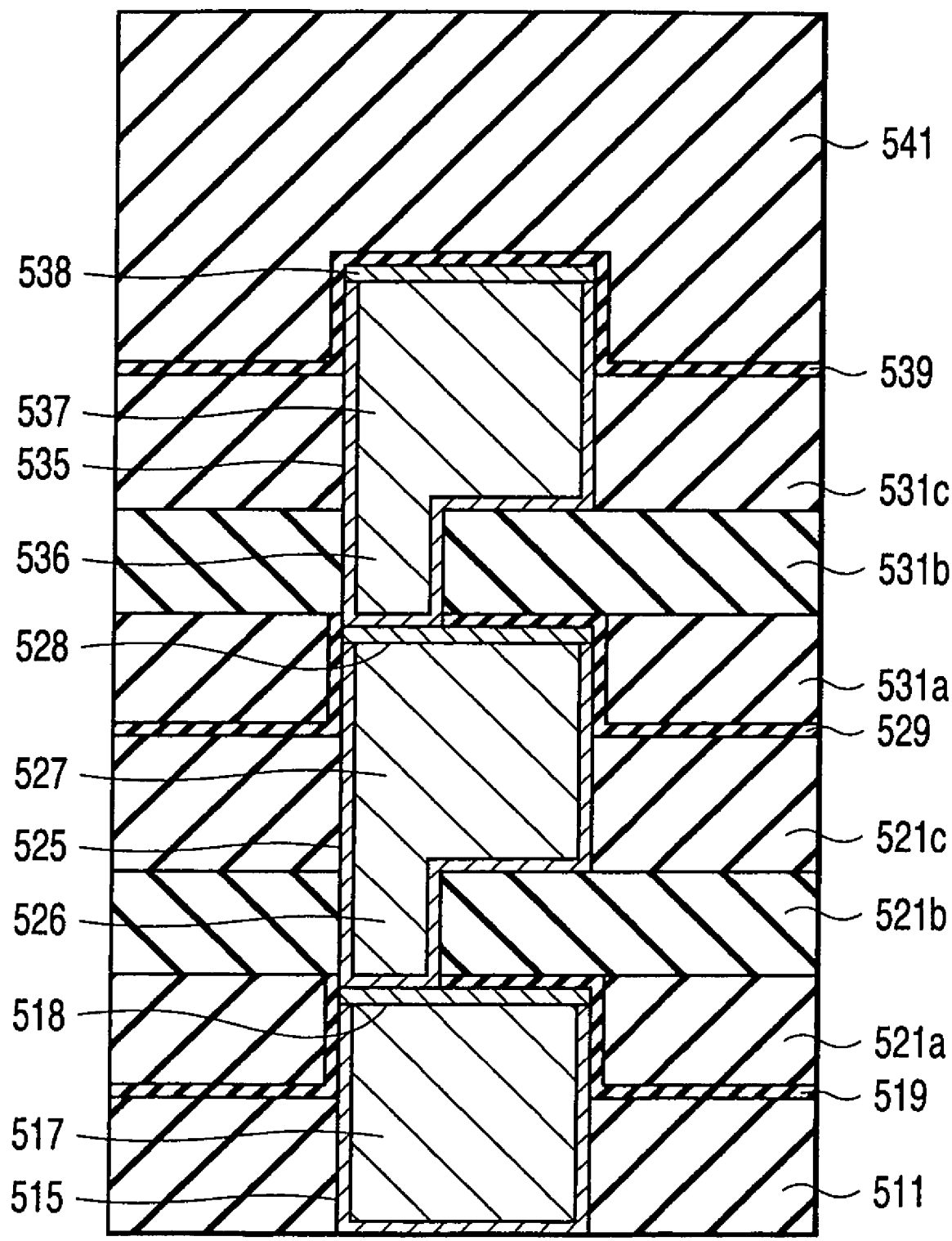
FIG. 18 is a sectional view illustrating the example of the method for manufacturing process sequent to FIG. 17B.

Step (9) Thereafter, the processes from the removal of the high-strength insulating film in step (4) (FIG. 16B) to the formation of the barrier conductive film preventing wiring material diffusion in step (8) (FIG. 17B) are repeated by a predetermined number of times. A multilevel wiring shown in FIG. 18 can be formed by carrying out the steps (4) to (6) (FIG. 16D), lastly. The fifth embodiment has been described a three-layer wiring by way of example. However, the number of wiring levels is not limited to three.

Figure 19:
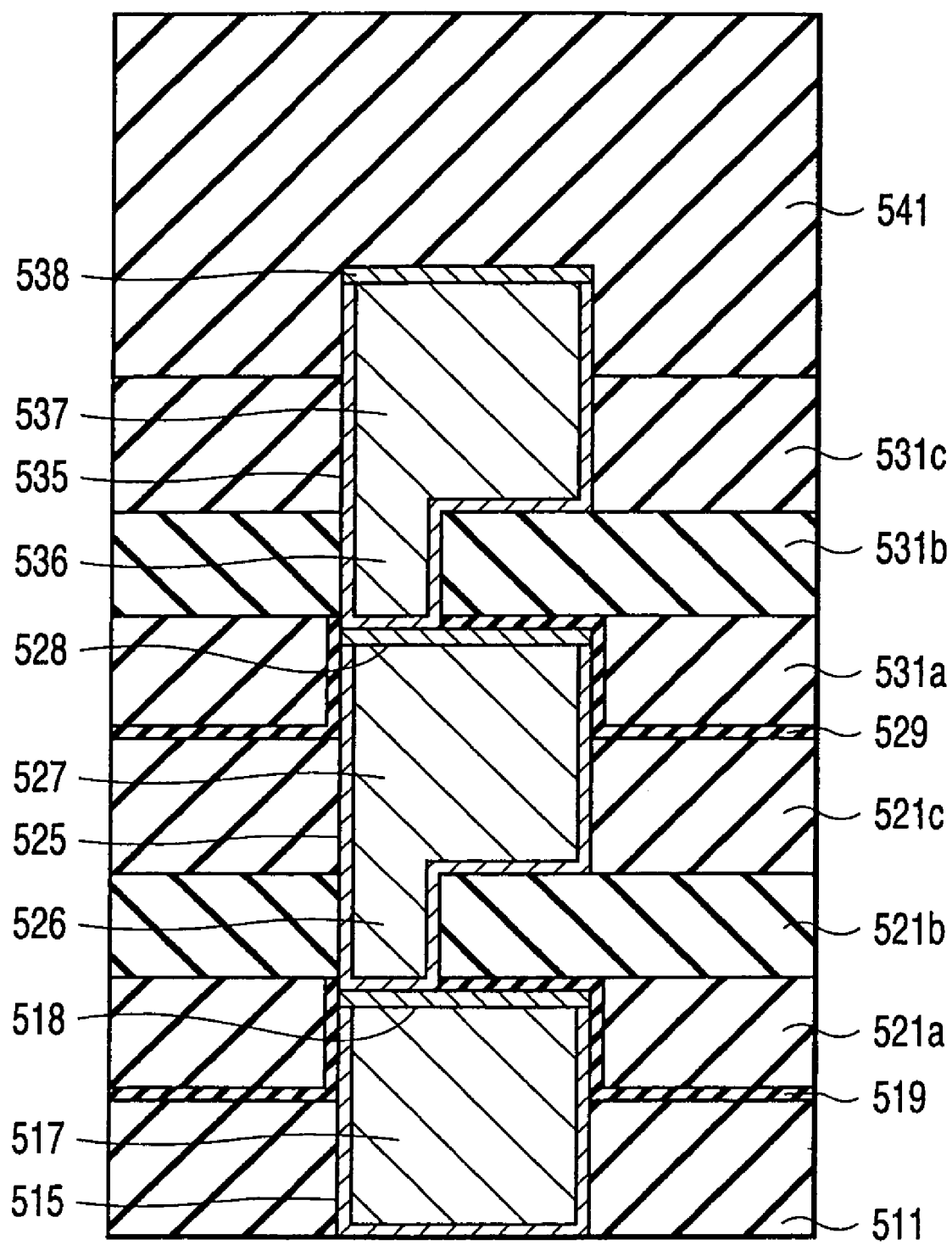
FIG. 19 is a sectional view showing an example of a semiconductor device according to a first modification of the fifth embodiment.

Various modifications can be made to the embodiment. According to a first modification to the fifth embodiment, it can be omitted some layers of the very thin barrier insulating films preventing wiring material diffusion, which are formed on the interfaces between two layered interwiring insulating films and the like in each level of all interwiring insulating films. That is, the barrier insulating films are formed only on a few levels of the lower interwiring insulating films, and the barrier insulating films are omitted in the upper interwiring insulating films, so that a multilevel wiring can be formed. FIG. 19 shows an example of the first modification. In FIG. 19, the barrier insulating films 519, 529 preventing wiring material diffusion are formed for wirings 517, 527 on a substrate side of multilevel wirings 517, 527, and 537 of three layers, while no barrier insulating film is formed for the wiring 537 of the uppermost layer. According to the first modification, the barrier insulating films are formed for the two layers of the wirings 517, 527 of the substrate side. However, a barrier insulating film can be formed only for the wiring 517 of the substrate side.

Figure 20:
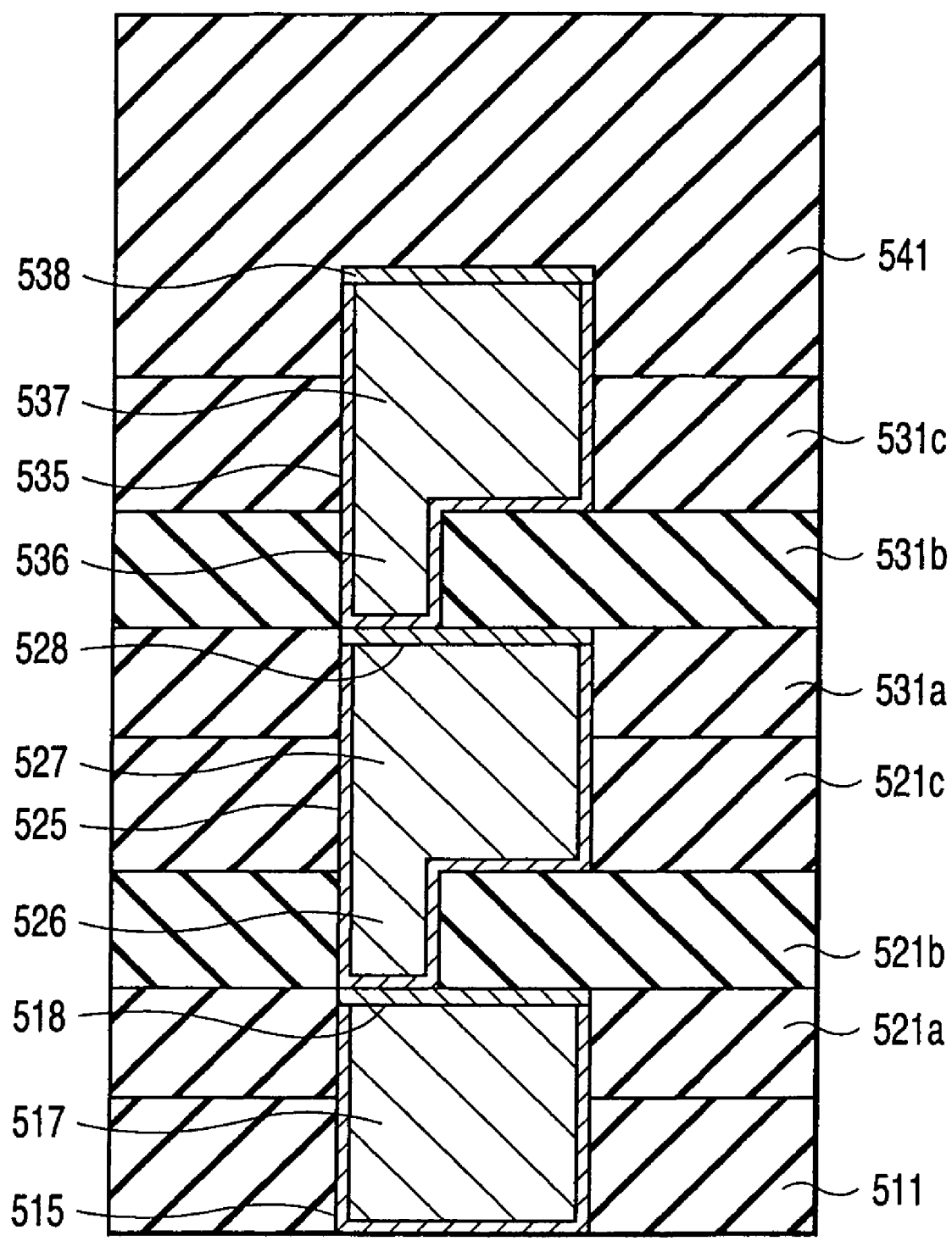
FIG. 20 is a sectional view showing an example of a semiconductor device according to a second modification of the fifth embodiment.

FIG. 20 shows a second modification. According to the second modification, a multilevel wiring is formed without forming a very thin barrier insulating film preventing wiring material diffusion in an interface between two layered interwiring insulating films or the like. This structure enables simplification of a manufacturing process. Besides, as in the case of the first modification, it is possible to increase a process margin with respect to misalignment in the formation of an interlevel contact hole.

FIG. 21 shows an example of a third modification. According to the third modification, interwiring and interlevel insulating films of three-layer are constituted of 2-layer insulting films 511, 521c and 531c, and 521b, 531b and 541 made of different low dielectric constant materials. The two layered insulating films are formed so that their interfaces can be positioned in side faces of Cu wirings 517, 527, and 537, and very thin barrier insulating films 519, 529, and 539 preventing wiring material diffusion are formed on the interfaces and surfaces of a Cu wiring thereabove, so that a multilevel wiring is constituted. According to the third modification, as in the case of the structure of the first modification shown in FIG. 19, it can be employed a structure in which no barrier insulating films preventing wiring material diffusion are formed in an upper wiring levels.

Figure 22:
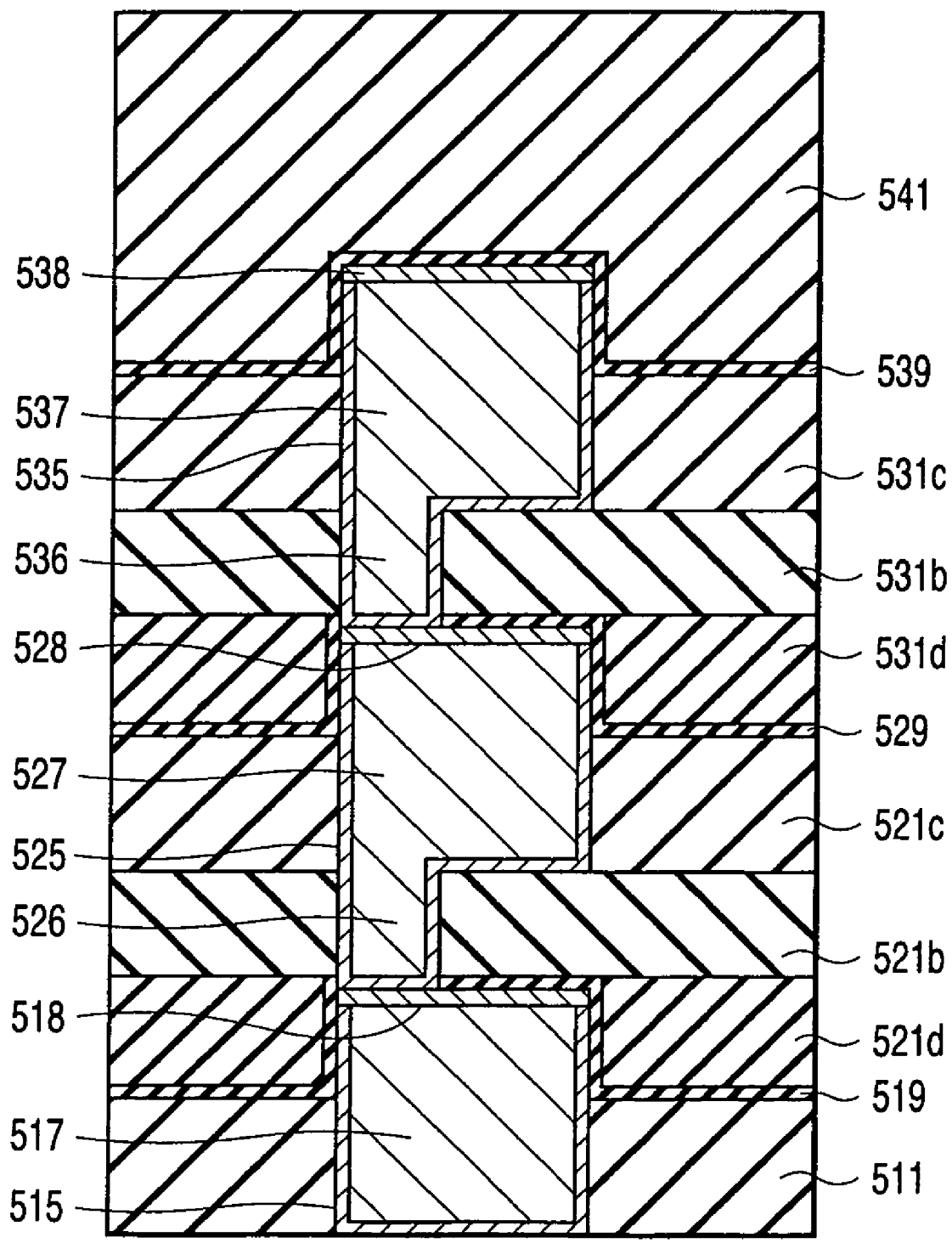
FIG. 22 is a sectional view showing an example of a semiconductor device according to a fourth modification of the fifth embodiment.

Furthermore, FIG. 22 shows a fourth modification. According to the fourth modification, interwiring and interlevel insulating films of three layers are constituted of insulating films made of three kinds of low dielectric constant materials having different selectivity in etching. For example, as shown in FIG. 22, the interwiring and interlevel insulating films can be constituted of insulating films 511, 521c, 531c, and 541 made of a first low dielectric constant material, insulating films 521d and 531d made of a second low dielectric constant material, and insulating films 521b and 531b made of a third low dielectric constant material.

A feature of the multilevel wiring structure of the fifth embodiment is that the interwiring insulating films include the two layered insulating films made of a low dielectric constant material, the interlevel insulating films are constituted of another low dielectric constant materials different from those of the interwiring insulating films, the barrier conductive film preventing wiring material diffusion is formed on the upper surface of the wiring, and the very thin barrier insulating film is formed on the interface between the two layered interwiring insulting films and on the wiring surfaces thereabove. Moreover, since formation of an interlevel contact hole and a Cu wiring trench for interconnecting the upper and lower wirings is carried out by selective etching for each insulating film, it is possible to increase a process margin.

Therefore, since most parts of the interwiring and interlevel insulating films are constituted of low dielectric constant films, it can be provided a multilevel wiring of a small interwiring capacitance as in the cases of the other embodiments. Additionally, even in the manufacturing process, a process margin by lithography and etching is designed being increased. Moreover, since the insulating film with large mechanical strength is effectively used only in the middle of the process, it can be suppressed damage given to the insulating film having the low dielectric constant material constituting the semiconductor device. As a result, no increase occurs in leakage current between the wirings or between the wiring levels.

The present invention is not limited to the foregoing embodiments. Various modifications can be made without departing from the teachings of the invention.

Figure 23:
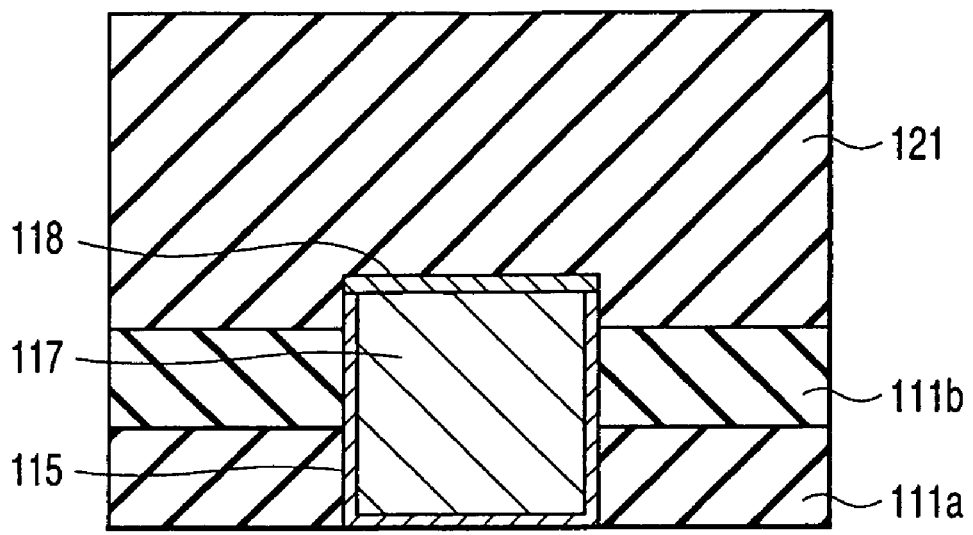
FIG. 23 is a sectional view showing an example of a semiconductor device according to a modification of the first and second embodiments.
Figure 24:
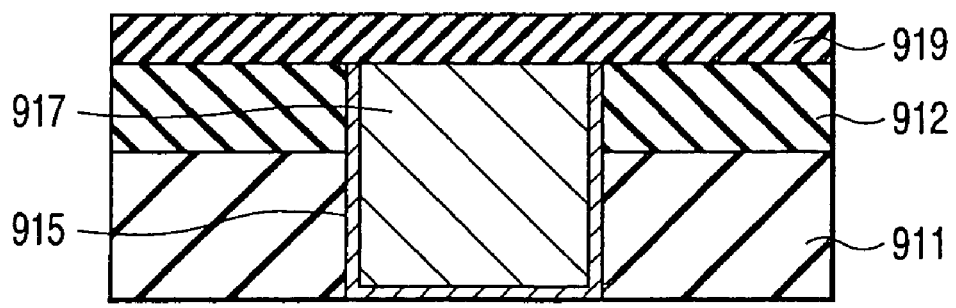
FIG. 24 is a sectional view showing an example of a semiconductor device according to a conventional technology.

FIG. 23 shows a modification of the first and second embodiments. As shown in FIG. 23, the interwiring and interlevel insulating films of the first and second embodiments can be constituted of low dielectric constant insulating films 111a, 111b, and 111c of a three layered structure. For the 3-layer insulating films, similar, or two or three kinds of different low dielectric constant materials can be used. For example, a stacked film can be formed in such a manner that on the first low dielectric constant insulating film 111a made of a first low dielectric constant material, the second low dielectric constant insulating film 111b made of a second low dielectric constant material different from the first is deposited, and the third low dielectric constant insulating film 111c made of the first or a third low dielectric constant material is deposited thereon.

According to another modification, regarding the barrier conductive film preventing wiring material diffusion formed on the upper surface of the Cu wiring or the like of the first and second embodiments, a high-melting point metal prepared by selective CVD or its nitride can be used in place of the CoW-containing high-melting point metal alloy prepared by selective plating. As the high-melting point metal, for example, Ta can be used. As the high-melting point metal nitride, for example, TiN, TaN, or the like can be used.

According to still another modification, regarding the barrier conductive film preventing wiring material diffusion of the third and fourth embodiments, an insulating film that has a similar function of preventing wiring material diffusion can be used. As the barrier insulating material preventing wiring material diffusion, for example, SiN, SiC, or SiCN deposited by, e.g., CVD or coating, can be used. In the case of using the barrier insulating film preventing wiring material diffusion, in formation of an interlevel contact hole, the barrier insulating film preventing wiring material diffusion, which appears on the bottom thereof, is removed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method for manufacturing a semiconductor device, comprising:
    depositing a first insulating film made of a first low dielectric constant material;
    depositing a second insulating film having mechanical strength larger than that of the first insulating film thereon;
    forming a wiring trench in the first and second insulating films;
    forming a first wiring by filling the wiring trench with a wiring material;
    forming a conductive film on an upper surface of the first wiring to prevent diffusion of the wiring material;
    removing the second insulating film;
    depositing a third insulating film on the first insulating film and the first wiring to prevent diffusion of the wiring material;
    depositing a fourth insulating film made of the first low dielectric constant material on the third insulating film;
    planarizing the fourth insulating film to a level of an upper surface of the third insulating film on an upper surface of the first wiring;
    forming a fifth insulating film made of a second low dielectric constant material on the fourth insulating film and the third insulating film; and
    forming a plug in the fifth insulating film to interconnect the first wiring and a second wiring to be formed thereon.

2. The method according to claim 1, wherein the conductive film is made of a high-melting point metal alloy containing cobalt-tungsten.

3. The method according to claim 1, wherein the third insulating film contains one of a silicon nitride, a silicon carbide, and a silicon carbonitride.

4. A method for manufacturing a semiconductor device, comprising:
    depositing a first insulating film made of a low dielectric constant material;
    depositing a second insulating film having mechanical strength larger than that of the first insulating film thereon;
    forming a wiring trench in the first and second insulating films;
    forming a first wiring by filling the wiring trench with a wiring material;
    forming a conductive film on an upper surface of the wiring to prevent diffusion of the wiring material;
    removing the second insulating film;
    depositing a third insulating film on the first insulating film and the first wiring to prevent diffusion of the wiring material;
    depositing a fourth insulating film made of a low dielectric constant material on the third insulating film;
    planarizing the fourth insulating film so as to expose the third insulating film on an upper surface of the first wiring;
    forming a fifth insulating film made of a second low dielectric constant material on the fourth insulating film and the third insulating film; and
    forming a plug in the fifth insulating film to interconnect the first wiring and a second wiring to be formed thereon.

5. The method according to claim 4, wherein the conductive film is made of a high-melting point metal alloy containing cobalt-tungsten.

6. The method according to claim 4, wherein the third insulating film contains one of a silicon nitride, a silicon carbide, and a silicon carbonitride.

* * * * *